United States Patent
Tashiro et al.

(10) Patent No.: US 8,268,670 B2
(45) Date of Patent: Sep. 18, 2012

(54) METHOD OF SEMICONDUCTOR DEVICE PROTECTION

(75) Inventors: Kazuhiro Tashiro, Kawasaki (JP);
Keisuke Fukuda, Kawasaki (JP);
Naohito Kohashi, Kawasaki (JP);
Shigeyuki Maruyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/240,508

(22) Filed: Sep. 22, 2011

(65) Prior Publication Data

US 2012/0005875 A1    Jan. 12, 2012

Related U.S. Application Data

(62) Division of application No. 12/872,131, filed on Aug. 31, 2010, now Pat. No. 8,164,181, which is a division of application No. 12/081,961, filed on Apr. 24, 2008, now Pat. No. 7,807,481, which is a division of application No. 10/800,630, filed on Mar. 16, 2004, now Pat. No. 7,382,046.

(30) Foreign Application Priority Data

Oct. 7, 2003  (JP) .................... 2003-348796

(51) Int. Cl.
*H01L 21/44*  (2006.01)
(52) U.S. Cl. .......... 438/106; 438/15; 438/125; 257/704; 257/710; 257/E23.14; 257/E23.193
(58) Field of Classification Search .......... 438/15, 438/106, 125; 257/704, 710, E23.114, E23.193
See application file for complete search history.

(56) References Cited

U.S. PATENT DOCUMENTS

| | | | |
|---|---|---|---|
| 2,692,210 A | 10/1954 | Burnham | |
| 3,528,955 A | 9/1970 | Lippman | |
| 3,864,124 A | 2/1975 | Breton et al. | |
| 4,069,916 A | 1/1978 | Fowler et al. | |
| 4,129,633 A | 12/1978 | Biddick | |
| 4,153,661 A | 5/1979 | Ree et al. | |
| 4,175,055 A | 11/1979 | Goller et al. | |

(Continued)

FOREIGN PATENT DOCUMENTS

EP    0 340 959 A2    11/1989

(Continued)

OTHER PUBLICATIONS

Japanese Office Action dated Sep. 7, 2010, issued in corresponding Japanese Patent Application No. 2003-348796 (with partial English translation).

(Continued)

*Primary Examiner* — Andy Huynh
(74) *Attorney, Agent, or Firm* — Westerman, Hattori, Daniels & Adrian, LLP

(57) ABSTRACT

A method for protecting a semiconductor device is disclosed that can improve reliability of a performance test for the semiconductor device and prevent damage to the semiconductor device during transportation or packaging for shipment. An IC cover is attached to the semiconductor device, which has height unevenness because it includes semiconductor chips and electric parts having different heights. The IC cover includes projecting portions and a base portion. After being attached to the semiconductor device, the projecting portions stand in a free area in the semiconductor device, and the base portion is supported by the projections to be separated from the semiconductor chips and electric parts in the semiconductor device. The IC cover is detachably attached to the semiconductor device.

2 Claims, 24 Drawing Sheets

U.S. PATENT DOCUMENTS

| | | | |
|---|---|---|---|
| 4,177,159 | A | 12/1979 | Singer |
| 4,194,040 | A | 3/1980 | Breton et al. |
| 4,287,232 | A | 9/1981 | Goller et al. |
| 4,313,972 | A | 2/1982 | Goller et al. |
| 4,317,789 | A | 3/1982 | Groult et al. |
| 4,320,185 | A | 3/1982 | Bernstein et al. |
| 4,336,217 | A | 6/1982 | Sauer |
| 4,354,958 | A | 10/1982 | Solomon |
| 4,383,010 | A | 5/1983 | Spaepen |
| 4,500,647 | A | 2/1985 | Solomon |
| 4,556,618 | A | 12/1985 | Shia |
| 4,822,701 | A | 4/1989 | Ballard et al. |
| 4,895,775 | A | 1/1990 | Kato et al. |
| 4,917,309 | A | 4/1990 | Zander et al. |
| 4,992,910 | A | 2/1991 | Evans |
| 5,100,747 | A | 3/1992 | Hayashida et al. |
| 5,150,283 | A | 9/1992 | Yoshida et al. |
| 5,168,019 | A | 12/1992 | Sugeno |
| 5,393,617 | A | 2/1995 | Klein |
| 5,450,279 | A | 9/1995 | Yoshida et al. |
| 5,478,363 | A | 12/1995 | Klein |
| 5,478,668 | A | 12/1995 | Gozdz et al. |
| 5,482,906 | A | 1/1996 | Sakai et al. |
| 5,557,497 | A | 9/1996 | Ivanov et al. |
| 5,557,504 | A | 9/1996 | Siegel et al. |
| 5,593,462 | A | 1/1997 | Gueguen et al. |
| 5,682,288 | A | 10/1997 | Wani |
| 5,706,165 | A | 1/1998 | Saito et al. |
| 5,848,702 | A | 12/1998 | Pakeriasamy |
| 6,020,634 | A | 2/2000 | Gerber et al. |
| 6,029,427 | A | 2/2000 | Freund et al. |
| 6,057,597 | A | 5/2000 | Farnworth et al. |
| 6,079,565 | A | 6/2000 | Walsh et al. |
| 6,107,680 | A | 8/2000 | Hodges |
| 6,384,734 | B1 | 5/2002 | Ohno et al. |
| 6,445,200 | B2 | 9/2002 | Haseyama |
| 6,538,196 | B1 | 3/2003 | MacDonald et al. |
| 6,611,054 | B1 | 8/2003 | Dunaway et al. |
| 6,631,807 | B2 | 10/2003 | Nemoto et al. |
| 6,690,284 | B2 | 2/2004 | Ohno et al. |
| 6,784,542 | B2 | 8/2004 | Fukasawa et al. |
| 6,828,676 | B2 | 12/2004 | Akai |
| 6,849,940 | B1 | 2/2005 | Chan et al. |
| 2002/0096661 | A1 | 7/2002 | Shinozaki et al. |
| 2002/0150812 | A1 | 10/2002 | Kaz et al. |
| 2002/0163773 | A1 | 11/2002 | Niiori et al. |
| 2003/0030963 | A1 | 2/2003 | Tennent et al. |
| 2003/0042618 | A1* | 3/2003 | Nose et al. .......... 257/778 |
| 2003/0113636 | A1 | 6/2003 | Sano et al. |
| 2003/0157314 | A1 | 8/2003 | Penneau et al. |
| 2003/0175494 | A1 | 9/2003 | Penneau et al. |
| 2003/0186110 | A1 | 10/2003 | Sloop |
| 2005/0064289 | A1 | 3/2005 | Suzuki et al. |
| 2005/0127535 | A1* | 6/2005 | Takahashi et al. ......... 257/787 |
| 2005/0266298 | A1 | 12/2005 | Mitchell et al. |
| 2005/0266990 | A1 | 12/2005 | Iwasaki et al. |
| 2006/0035785 | A1 | 2/2006 | Tanaka |

FOREIGN PATENT DOCUMENTS

| | | |
|---|---|---|
| JP | 61-17147 A | 8/1979 |
| JP | 62-44443 A | 3/1987 |
| JP | 62-052950 U | 4/1987 |
| JP | 64-80596 A | 3/1989 |
| JP | 2-17659 A | 1/1990 |
| JP | 4-117448 U | 10/1992 |
| JP | 6-085236 U | 12/1994 |
| JP | 7-45751 A | 2/1995 |
| JP | 7-106035 A | 4/1995 |
| JP | 8-83658 A | 3/1996 |
| JP | 8-88299 A | 4/1996 |
| JP | 9-102537 A | 4/1997 |
| JP | 10-41035 A | 2/1998 |
| JP | 10-211986 A | 8/1998 |
| JP | 11-64443 A | 3/1999 |
| JP | 2000-292487 A | 10/2000 |
| JP | 2001-015237 A | 1/2001 |
| JP | 2003-515247 A | 4/2003 |

OTHER PUBLICATIONS

Japanese Office Action dated Oct. 4, 2011, issued in corresponding Japanese Patent Application No. 2003-348796. (w/partial English translation).

* cited by examiner

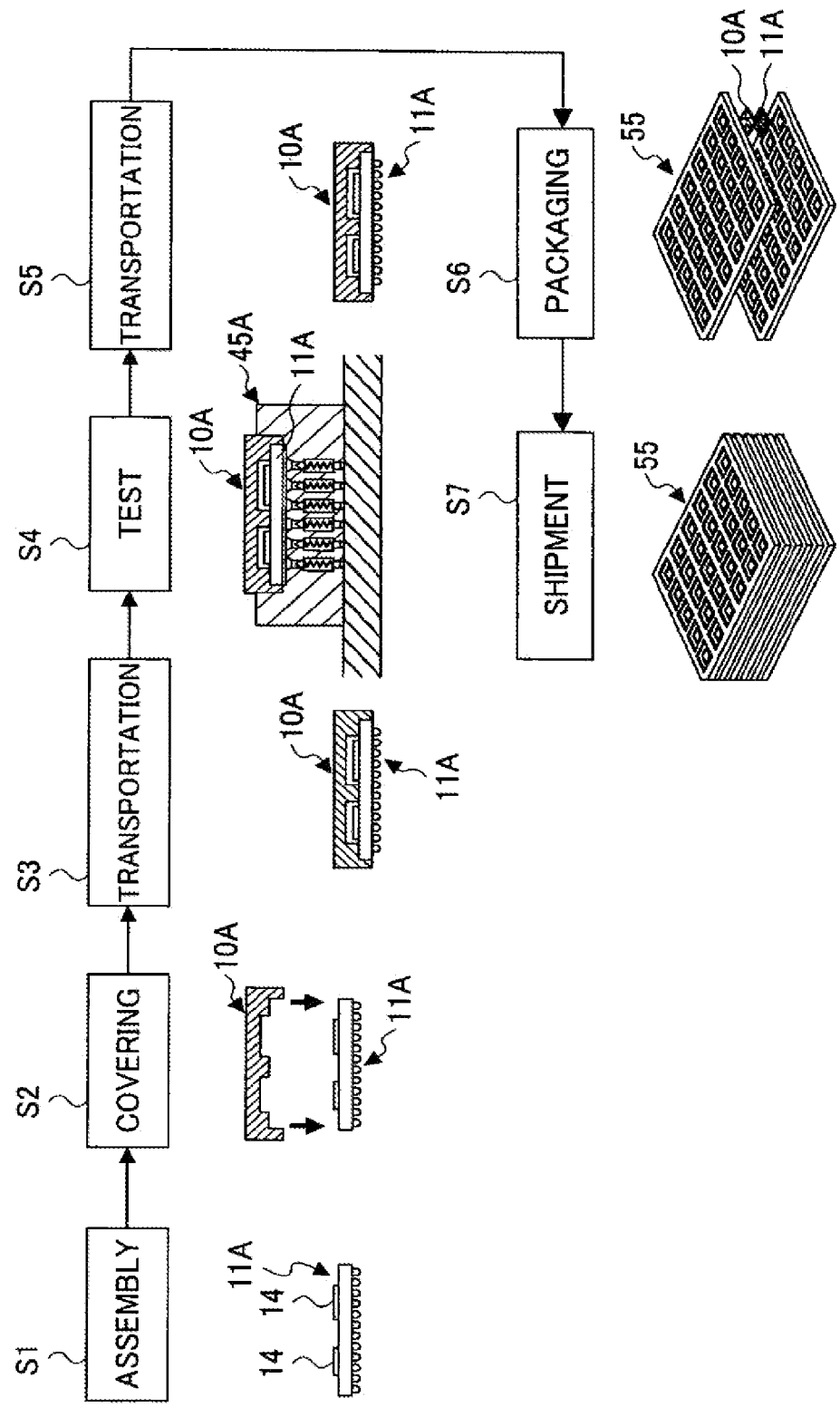

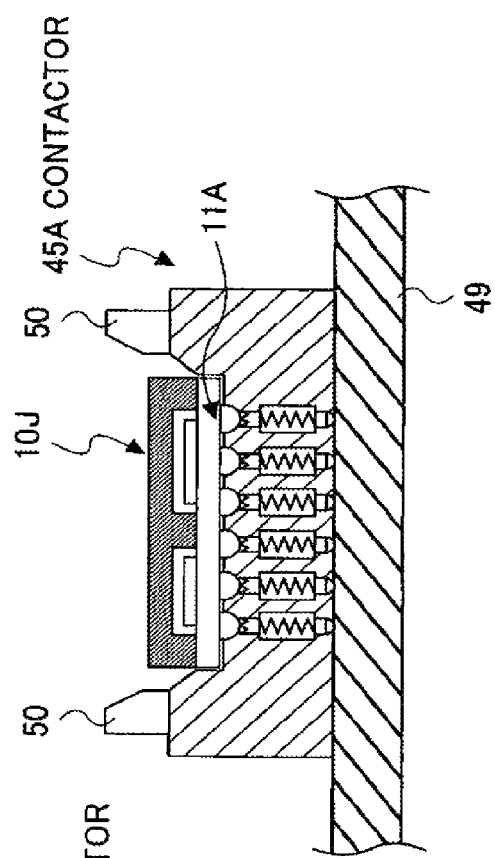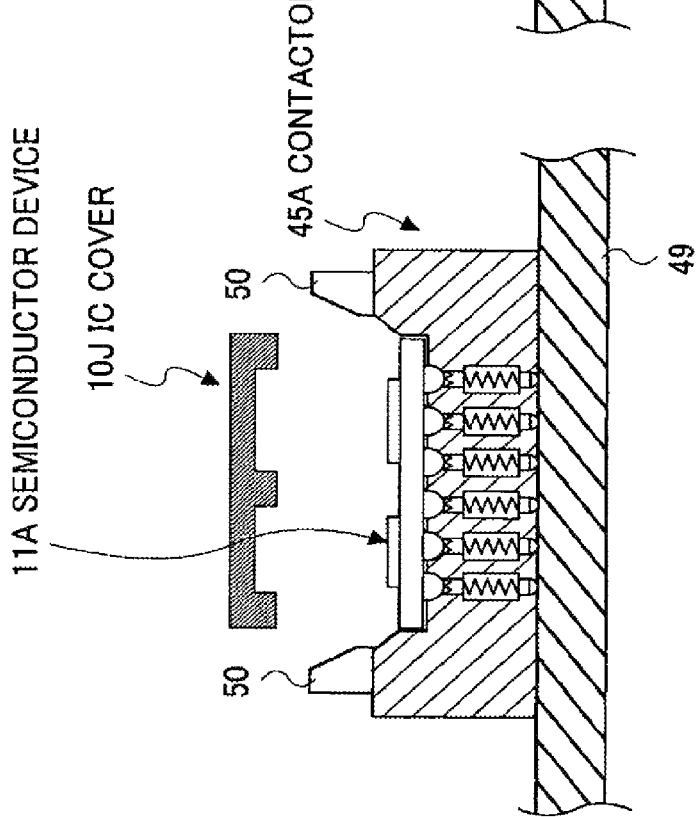

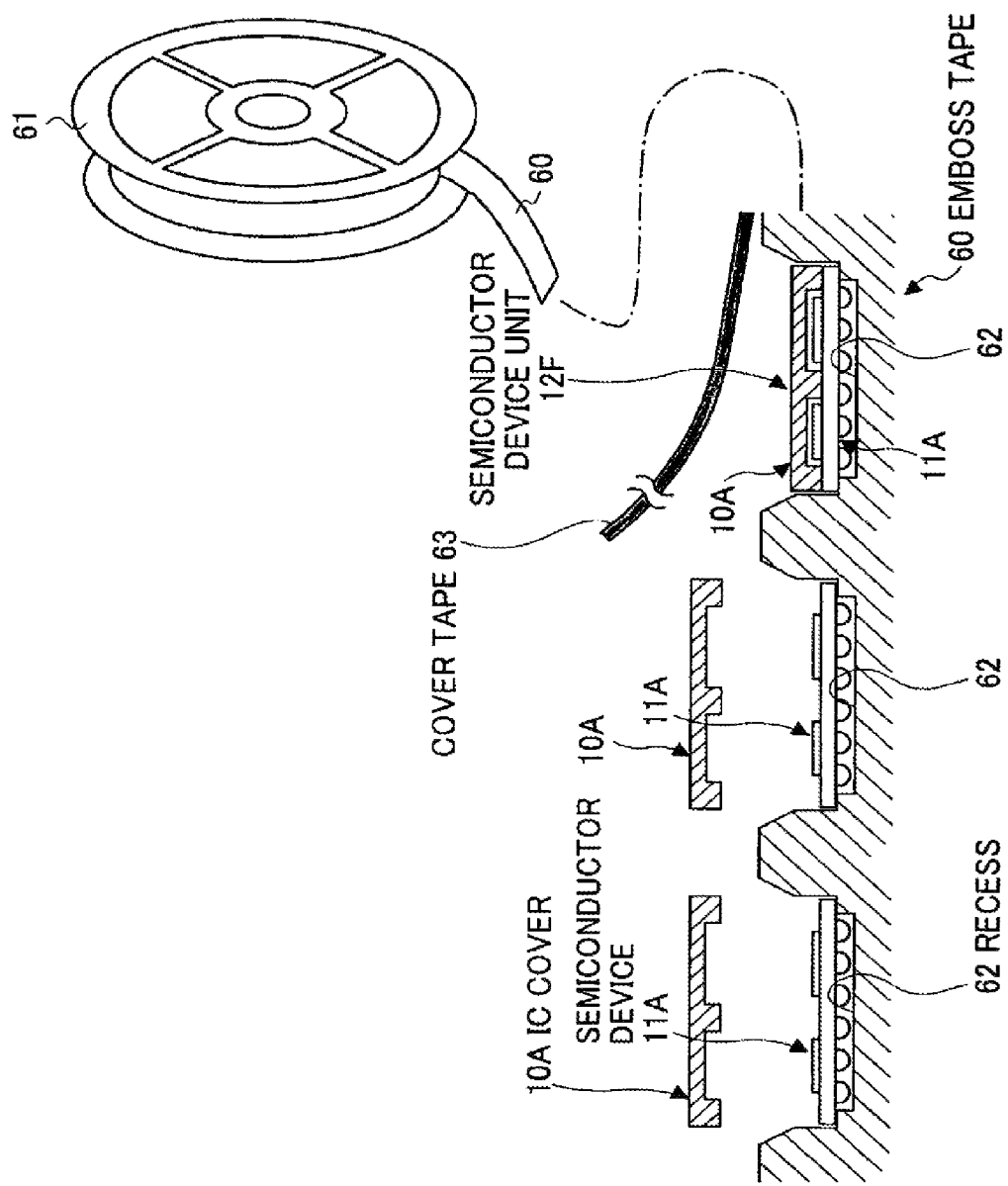

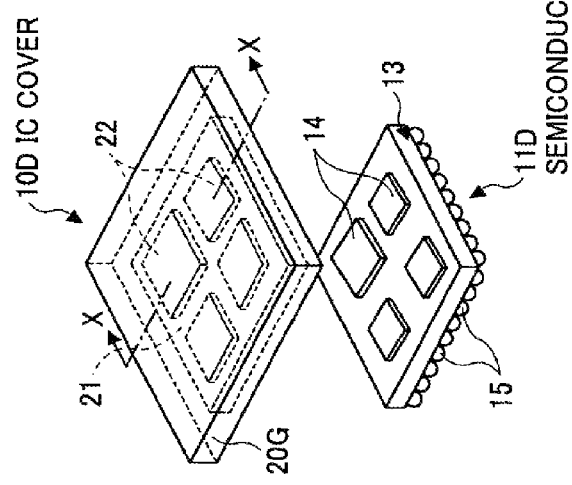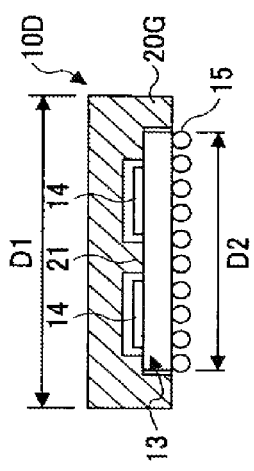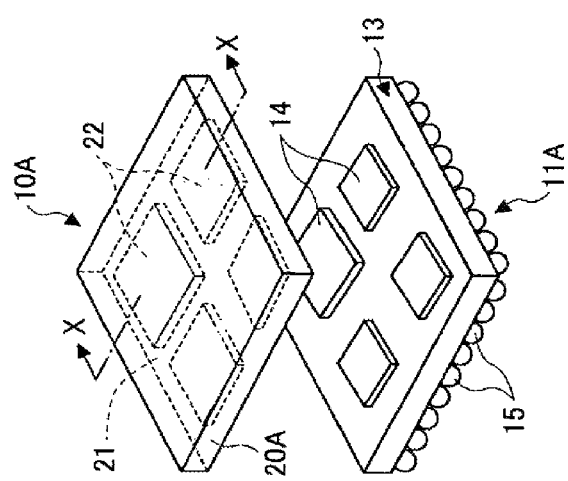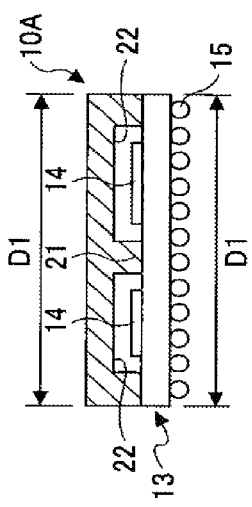
FIG.13A  FIG.13C
FIG.13B  FIG.13D

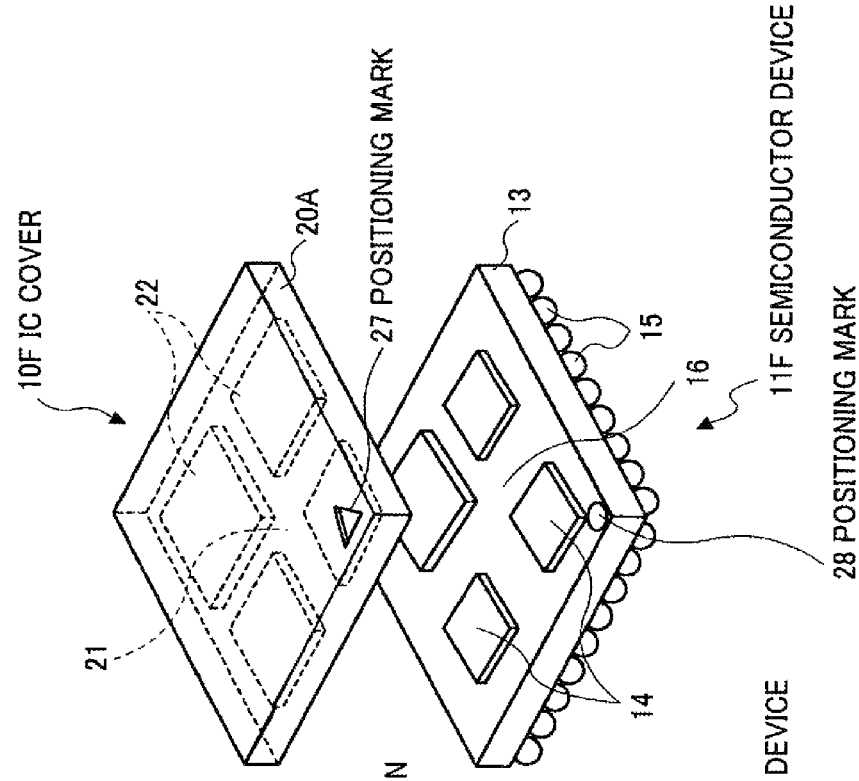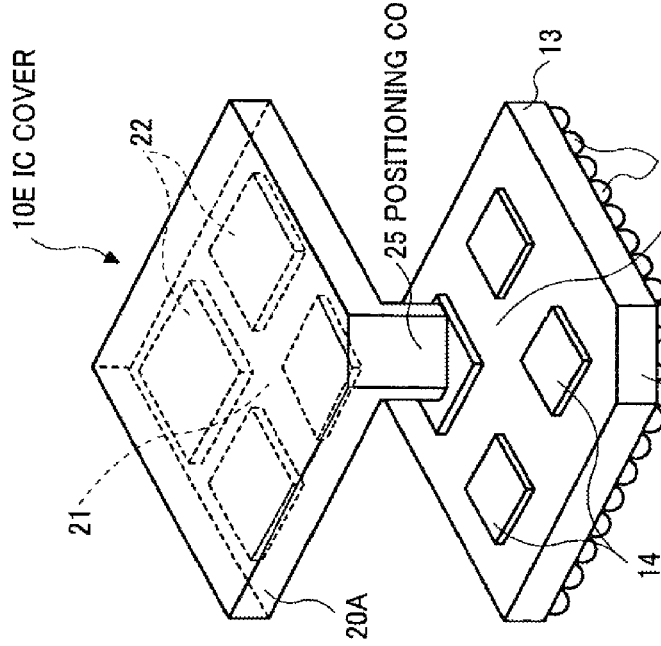

METHOD OF SEMICONDUCTOR DEVICE PROTECTION

CROSS-REFERENCE TO RELATED APPLICATIONS

This application is a divisional application of U.S. patent application Ser. No. 12/872,131 filed on Aug. 31, 2010 which is divisional of U.S. patent application Ser. No. 12/081,961, filed on Apr. 24, 2008, now U.S. Pat. No. 7,807,481, which is a divisional of U.S. patent application Ser. No. 10/800,630 filed on Mar. 16, 2004, now U.S. Pat. No. 7,382,046, which is based on and claims the benefit of priority from Japanese Patent Application No. 2003-348796, filed on Oct. 7, 2003, the entire contents of which are incorporated herein by reference.

BACKGROUND OF THE INVENTION

1. Field of the Invention

The present invention relates to a semiconductor device unit that enables easy transportation, test, or packaging and shipment of a semiconductor device, a packaging structure of the semiconductor device, a semiconductor device protection method, and a protection cover of the semiconductor device.

2. Description of the Related Art

In the recent years and continuing, because portable devices, such as PDAs (personal digital assistant), mobile phones, and digital cameras are becoming light and small, it is also required that semiconductor devices used in these portable devices be light and small.

In response to this requirement, the so-called "chip size package" (CSP) is rapidly spreading, which further reduces package size close to the size of the packaged semiconductor element (chip).

Typical examples of CSP include FBGA (Fine-pitch Ball Array), FLGA (Fine-pitch Land Grid Array).

In a CSP, a technique known as Package Stacked MCP (Multi Chip Package) may be used to include more semiconductor chips.

In semiconductors which form a CPU (Central Processing Unit), since operating temperature largely increases due to increase of power consumption related to high-speed operation, a heat spreader made of a metal having high heat conductance is attached to the top of the semiconductor device for cooling.

As mentioned above, in order to achieve for small size and light weight of an electronic device in which such a semiconductor device is installed, the semiconductor device is required to be light and thin-shaped, and thus frequently a cover or a lid is not provided on an interposer in the semiconductor device.

In a semiconductor device generating a large amount of heat and having high power consumption, the temperature of the built-in semiconductor chip tend to increase, hence after mounting of the semiconductor chip, it is necessary to directly cool the top surface of the chip. For example, Japanese Laid-Open Patent Application No. 8-99299 (page 4, 5, and FIG. 2) discloses a technique of directly cooling a semiconductor chip, in which a heat sink made of a metal having high heat conductance is attached for cooling.

There is a more efficient cooling technique involving directly cooling the surface of a semiconductor chip with a liquid cooling device. When this technique is used, because it is necessary to directly expose the surface of the semiconductor chip, a metal lid or a heat spreader is not attached to the top surface of the semiconductor chip, hence the chip, a liquid sealing resin, and electronic parts like capacitors are exposed to the outside.

In the Package Stacked MCP (Multi Chip Package) used for stacked mounting, that is, further stacking a second semiconductor device on a first semiconductor device, the chip and the liquid sealing resin of the first semiconductor device, which is on the lower side, are exposed, and on the top side of the first semiconductor device, there are projecting solder balls to be joined to the second semiconductor device on the upper side.

In a flip chip mounting in which a semiconductor device is mounted to face downward, in order to decrease height of the mounting of the semiconductor device, usually sealing with resin is not conducted. Also in this case, on the top of the semiconductor device, the chip is exposed.

For a semiconductor device whose semiconductor chip and electric parts are exposed on the top thereof, contact damage to the chip and the parts should be considered during performance tests, transportation, and packaging for shipment. Especially, in the performance tests, when pressing a semiconductor device on a contactor or into a socket, only the chip itself is directly pressed, and this may cause cracks or defects in the chip.

Further, when pressing a number of semiconductor chips at the same time, the load applied on the semiconductor chips may be non-uniform because of unevenness of the surface of the semiconductor device caused by height differences and deviation of mounting positions of the semiconductor chips. This is the so-called unbalanced load problem.

When unbalanced load occurs in performance tests, external connection terminals of the semiconductor device are not in good connection condition with terminals of the testing device, and this greatly lowers reliability of the test.

When unbalanced load occurs in packaging and shipment, semiconductor devices may be damaged during transportation due to application of external forces.

When a semiconductor chip is sealed by means of bonding, which uses a liquid sealing resin, but not by means of resin sealing using resin molding, because the top surface of the semiconductor device is uneven and has a low flatness, it is very difficult to press the top surface of the semiconductor device uniformly in performance tests. Thus, unbalanced load occurs also in this case, greatly lowering reliability of the performance tests and in transportation after shipment.

SUMMARY OF THE INVENTION

Accordingly, it is an object of the present invention to solve one or more of the problems of the related art.

It is a more specific object of the present invention to provide a method of protecting a semiconductor device that can improve reliability of a performance test and can effectively prevent damage to the semiconductor device during packaging for shipment, a protection cover of the semiconductor device, a semiconductor device unit, and a semiconductor device packaging structure.

According to the present invention, because the semiconductor device is protected by a protection member, when a performance test is conducted for the semiconductor device, it is possible to improve reliability of the performance test. In addition, during packaging and shipment of the semiconductor device, the protection member can effectively prevent damage to the semiconductor device. Furthermore, because the protection member is detachably attached to the semiconductor device, the protection member can be removed when necessary.

According to the present invention, a number of treatments are performed for the semiconductor device with a protection member being attached to the semiconductor device. Therefore, it is possible to prevent damage to the semiconductor device during the treatments or in transportation for next treatments.

According to the present invention, regardless of unevenness of a surface of the semiconductor device, it is possible to uniformly press the semiconductor device, and this improves the reliability of the test.

According to the present invention, because the semiconductor device protection cover is harder than the semiconductor device, the semiconductor device protection cover can effectively protect the semiconductor device.

According to the present invention, because the semiconductor device protection cover has hardness lower than that of the semiconductor device, the semiconductor device protection cover can hardly cause damage to the semiconductor device at the contacting position of the projecting portion and the semiconductor device.

According to the present invention, even when a large external force is applied to the semiconductor device, this force can be absorbed when the protection cover is elastically deformed, and thus effectively protecting the semiconductor device.

According to the present invention, because the projecting portion and the base portion of the semiconductor device protection cover possess conductivity, even when static electricity is generated between the semiconductor device and the protection cover when mounting the protection cover to the semiconductor device, the static electricity does not cause damage (the so-called "static electricity damage") to the semiconductor device.

According to the present invention, because the semiconductor device protection cover is engaged by an engaging portion with the semiconductor device with the protection cover being attached to the semiconductor device, it is possible to prevent disengagement of the protection cover from the semiconductor device.

According to the present invention, because the base portion of the protection cover has a predetermined shape irrespective of the outer shape of the semiconductor device, even though the semiconductor device may have various kinds of outer shapes or size, when the protection cover is attached to the semiconductor device, the overall outer shape and size turn into the predetermined one, therefore, when transporting or in a performance test of the semiconductor device having various kinds of shapes and size, it is not necessary to change the design of the protection cover, that is, various devices are standardized by the protection cover.

According to the present invention, because the surface of the semiconductor device is protected by a protection cover, parts on the surface of the semiconductor device can be protected.

According to the present invention, the semiconductor device and the semiconductor device protection cover are set in position when the first positioning member on the semiconductor device and the second positioning member the semiconductor device protection cover are engaged with each other, so that the semiconductor device and the semiconductor device protection cover can be easily and correctly set in position.

According to the present invention, the first positioning member and the second positioning member can be easily formed.

According to the present invention, because the projection and the recess are engaged with each other while being guided by an inclined surface, the engagement becomes very easy.

According to the present invention, because the peripheral part of the semiconductor device is used as the first positioning member, it is not necessary to separately prepare positioning members on the semiconductor device, and this makes the structure of the positioning mechanism simple.

According to the present invention, because the wall and the peripheral part are engaged with each other while being guided by the inclined surface, the engagement becomes very easy.

According to the present invention, by making recognition marks acting as the first positioning member and the second positioning member in consistent, the semiconductor device and the semiconductor device protection cover can be set in position.

According to the present invention, when packaging a semiconductor device in a tray having a first semi-tray and a second semi-tray, because the semiconductor device is protected by a protection cover between the first semi-tray and a surface of the semiconductor device, it is possible to prevent damage to the semiconductor device during transportation after the packaging process.

According to the present invention, when packaging a semiconductor device on an embossed tape, because the semiconductor device is protected by a protection cover on the surface of the semiconductor device, it is possible to prevent damage to the semiconductor device during transportation after the packaging process.

These and other objects, features, and advantages of the present invention will become more apparent from the following detailed description of the preferred embodiments given with reference to the accompanying drawings.

BRIEF DESCRIPTION OF THE DRAWINGS

FIG. 1 is a diagram schematically showing a series of treatments, including fabrication of a semiconductor device and various processing conducted for the semiconductor device;

FIGS. 5A and 5B are perspective views for explaining the test step continuing from FIG. 4;

FIG. 8 is a cross-sectional view for schematically showing package of the semiconductor devices 11A using a strip-shaped packaging material according to the first embodiment of the present invention;

FIG. 13A is a perspective view of the IC cover 10A and the semiconductor device 11A as shown in the first embodiment;

FIG. 13B is a cross-sectional view of the IC cover 10A and the semiconductor device 11A along the line XX in FIG. 13A;

FIG. 13C is a perspective view of an IC cover 10D and a semiconductor device 11D according to a fourth embodiment;

FIG. 13D is a cross-sectional view of the IC cover 10D and the semiconductor device 11D along the line XX in FIG. 13C;

FIG. 18A is a perspective view of an IC cover 10E and a semiconductor device 11E, as a first example according to a seventh embodiment. The IC cover 10E and the semiconductor device 11E form a semiconductor device unit 12D;

FIG. 18B is a perspective view of an IC cover 10F and a semiconductor device 11F, as a second example according to the seventh embodiment. The IC cover 10F and the semiconductor device 11F form a semiconductor device unit 12E;

DESCRIPTION OF THE PREFERRED EMBODIMENTS

Figure 2A:
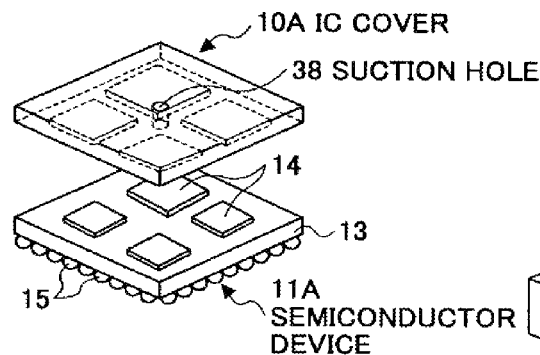
FIGS. 2A and 2B are perspective views of an IC cover 10A, a semiconductor device 11A and semiconductor device unit 12A according to a first embodiment and showing the covering step S2 in FIG. 1, in which the IC cover 10A is attached to the semiconductor device 11A.

Below, preferred embodiments of the present invention are explained with reference to the accompanying drawings.

FIG. 1 is a diagram schematically showing a series of common treatments performed for a semiconductor device including fabrication and various processing.

In the present invention, a semiconductor device 11A fabricated in an assembly step, indicated as S1, is processed in various steps until being shipped; these steps include a covering step (S2), a transportation step (S3), a test step (S4), a transportation step (S5), a packaging step (S6), and a shipment step (S7).

The semiconductor device 11A is a so-called MCM (Multi Chip Module) semiconductor device, in which one or more semiconductor chips 14 are mounted on an interposer (a circuit board) together with capacitance elements having a required capacity.

In order to obtain small size and light weight of an electronic device in which the semiconductor device 11A is installed, the semiconductor device 11A is required to be light and thin-shaped, thus frequently a cover or a lid is not provided on the interposer in the semiconductor device.

For this reason, a semiconductor chip 14 or other electric parts are exposed, and in the aforesaid transportation steps S3 and S5, test step S4, packaging step S6, and shipment step S7, it is necessary to prevent any damage to the exposed semiconductor chip 14.

In the present invention, in the covering step S2 after the assembly step S1, an IC cover 10A (corresponding to the semiconductor device protection cover in claims of the present invention) is mounted. Then, in the subsequent steps, the semiconductor device 11A is protected by the IC cover 10A. As a result, in the test step S4, in which the performance of the semiconductor device 11A is tested, because of the IC cover 10A, damage to the semiconductor device 11A is prevented, further, the semiconductor device 11A can be reliably connected to a testing apparatus, and this improves the reliability of the performance test.

Also in the transportation steps S3 and S5, packaging step S6 and shipment step S7, the semiconductor device 11A is protected by the IC cover 10A, preventing damage to the semiconductor device 11A.

The IC cover 10A is detachably mounted to the semiconductor device 11A, and the IC cover 10A can be easily removed when necessary.

Below, preferred embodiments of the present invention are explained.

First Embodiment

As described above, in the fabrication and processing steps as shown in FIG. 1, after the semiconductor device 11A is fabricated in step S1, in the subsequent step S2, the IC cover 10A is mounted on the semiconductor device 11A. In the subsequent transportation steps S3 and S5, test step S4, packaging step S6, and shipment step S7, the semiconductor device 11A is processed with the IC cover 10A mounted on the semiconductor device 11A.

In the present embodiment, the covering step S2 is performed before steps S3 through S7 are executed, but the timing of mounting the IC cover 10A on the semiconductor device 11A is not limited to this. The IC cover 10A can be mounted on the semiconductor device 11A at any stage (for example, between step S3 and step S4) when necessary. However, it is preferable to mount the IC cover 10A on the semiconductor device 11A right after fabrication and before the various treatments from steps S3 to S7, because this can prevent damage to the semiconductor device 11A.

Operations in each of the above steps are described with reference to the accompanying figures.

Figure 2B:
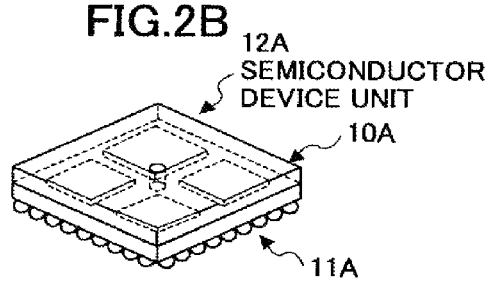

FIGS. 2A and 2B are schematic views showing the covering step S2 in FIG. 1, in which the IC cover 10A is mounted on the semiconductor device 11A.

Figure 2C:
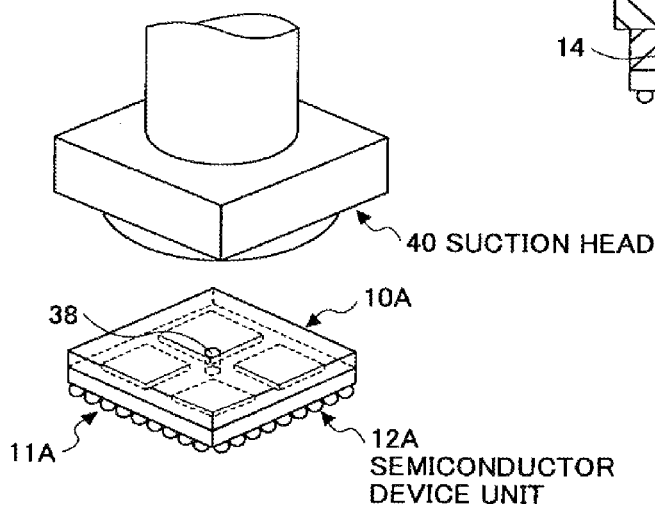
FIGS. 2C through 2E are perspective views showing a suction head 40 and showing the transportation step according to the first embodiment of the present invention.
Figure 2D:
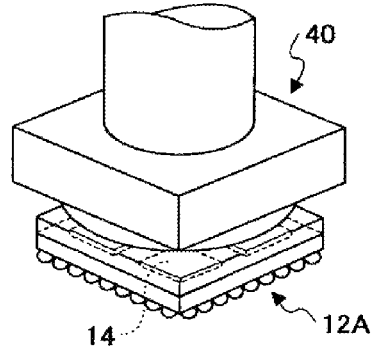
Figure 2E:
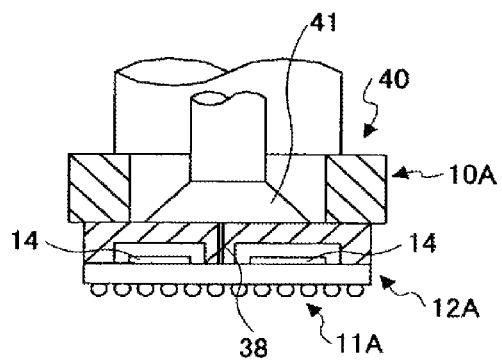

FIGS. 2C through 2E are schematic views showing the transportation step S3 or S5 in FIG. 1, in which the semiconductor device 11A is transported to an apparatus for testing or to an apparatus for packaging and shipment.

In the covering step S2, as shown in FIG. 2A, the IC cover 10A and the semiconductor device 11A are prepared, and as shown in FIG. 2B, the IC cover 10A is mounted on the semiconductor device 11A, thus, forming a semiconductor device unit 12A. As shown below, in the present embodiment, because both the semiconductor device 11A and the IC cover 10A are clamped by vacuum (low pressure) suction for transportation, a suction hole 38 is formed in the IC cover 10A.

FIG. 2C shows a suction head 40 for transporting the semiconductor device unit 12A. The suction head 40 is installed to a robot arm (not-illustrated) movable in three dimensions. The suction head 40 has a suction nozzle 41 (shown in FIG. 2E), which is connected to a not-illustrated pump.

During the transportation step S3 or S5, as shown in FIG. 2C, the suction head 40 is moved to a position right above the semiconductor device unit 12A. Next, as shown in FIG. 2D, the suction head 40 is moved to be in contact to the IC cover 10A of the semiconductor device unit 12A. Under this condition, the not-illustrated pump is started to operate, and the semiconductor device unit 12A is suctioned through the suction nozzle 41 and the suction hole 38 on the IC cover 10A. Thus, the semiconductor device unit 12A can be transported while being attached to the suction head 40 by suction. Since the suction head 40 is in contact with the top of the semiconductor device unit 12A, a contact force, an external force, is imposed on the semiconductor device unit 12A. However, because the semiconductor device 11A is protected by the IC cover 10A, the semiconductor chip 14 does not receive the external force directly. Hence, during the transportation step S3 or S5, the semiconductor device 11A is effectively protected.

Next, the test step S4 is explained.

Figure 3:
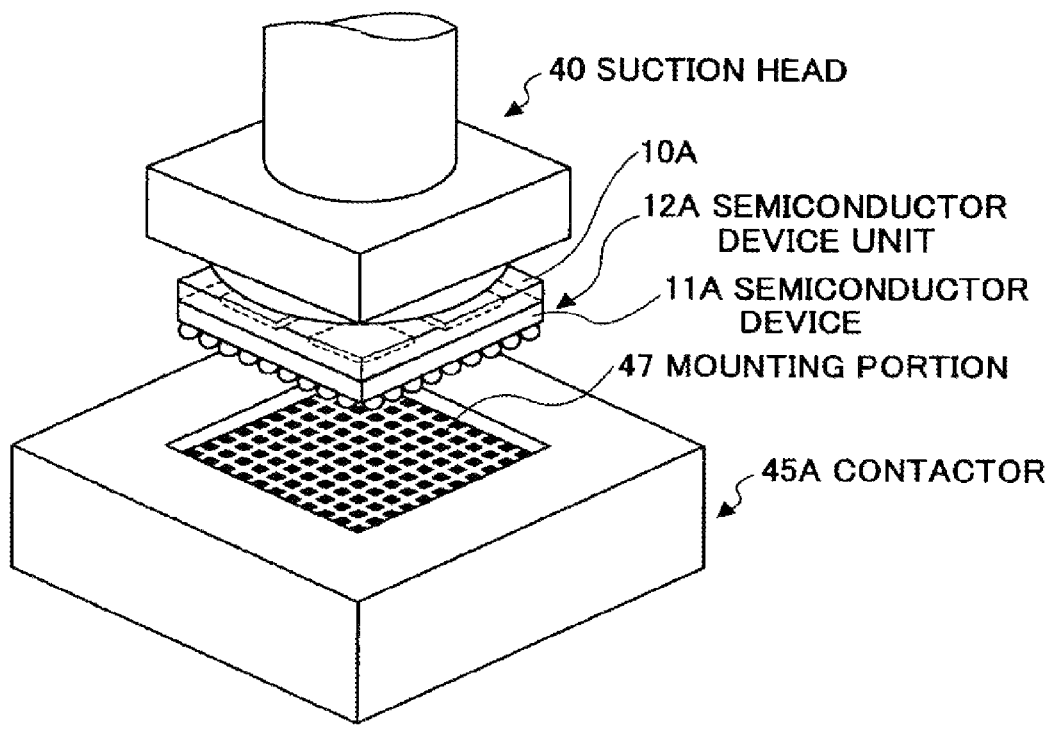
FIG. 3 is a perspective view for explaining the test step according to the first embodiment of the present invention.

FIG. 3 is a schematic view for explaining the test step S4 shown in FIG. 1.

Figure 4:
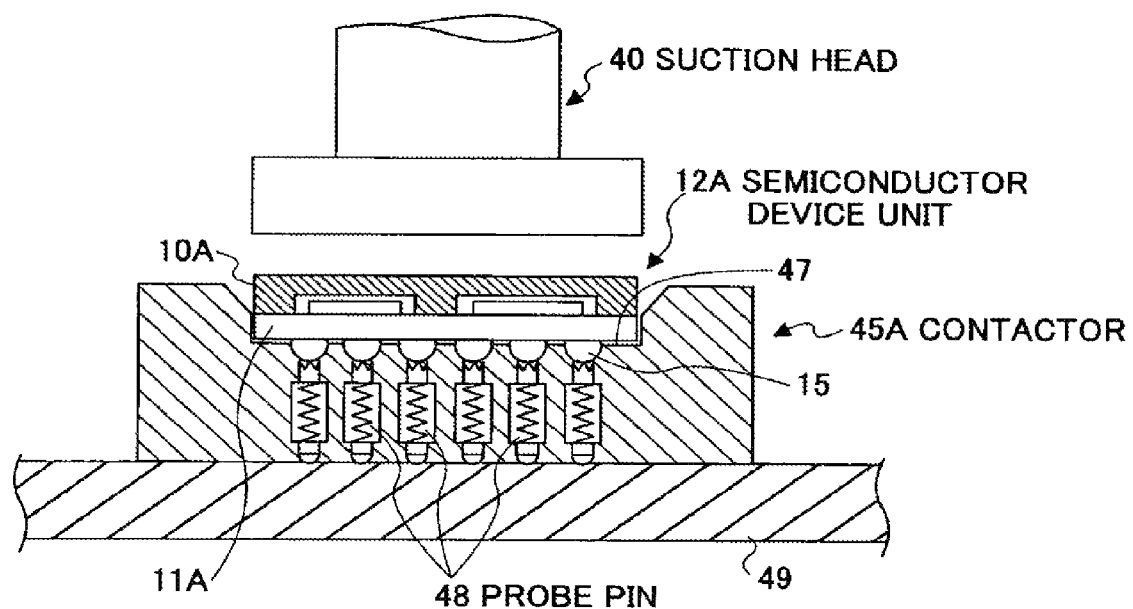
FIG. 4 is a schematic view for explaining the test step continuing from FIG. 3.

FIG. 4 is a schematic view for explaining the test step S4 continuing from FIG. 3.

In the test step S4, a performance test or a burn-in test is conducted for the semiconductor device 11A. The tests for the semiconductor device 11A are conducted using a contactor 45A illustrated in FIG. 3 and FIG. 4.

As shown in FIG. 3 and FIG. 4, there is a mounting portion 47 on the top of the contactor 45A for mounting the semiconductor device 11A. The mounting portion 47 has a number of probe pins 48 arranged in correspondence to solder balls 15, which are arranged on a surface of the interposer 13 of the semiconductor device 11A, forming external connection terminals of the semiconductor device 11A. These probe pins 48 are electrically connected to a tester. Thus, being mounted on the contactor 45, the semiconductor device 11A is connected to a tester to execute a performance test and other various tests.

In the test step S4, first, the suction head 40 conveys the semiconductor device unit 12A to a position above the contactor 45A. Next, the suction head 40 is moved downward to mount the semiconductor device unit 12A, or, specifically, the semiconductor device 11A, in the mounting portion 47 of the contactor 45A.

At this stage, the semiconductor device 11A is just located in the mounting portion 47, but the probe pins 48 and the solder balls 15 are not reliably electrically connected to each other. For this reason, it is necessary to press the semiconductor device 11A against the mounting portion 47.

The contactor 45A shown in FIG. 3 and FIG. 4 does not have a lid. In this case, the pressing treatment may be conducted by further moving the suction head 40 downward into the contactor 45A, or by pushing the semiconductor device unit 12A toward the contactor 45A by a not-illustrated pressing device.

FIGS. 5A and 5B are schematic view for explaining the test step S4 continuing from FIG. 4.

Figure 6:
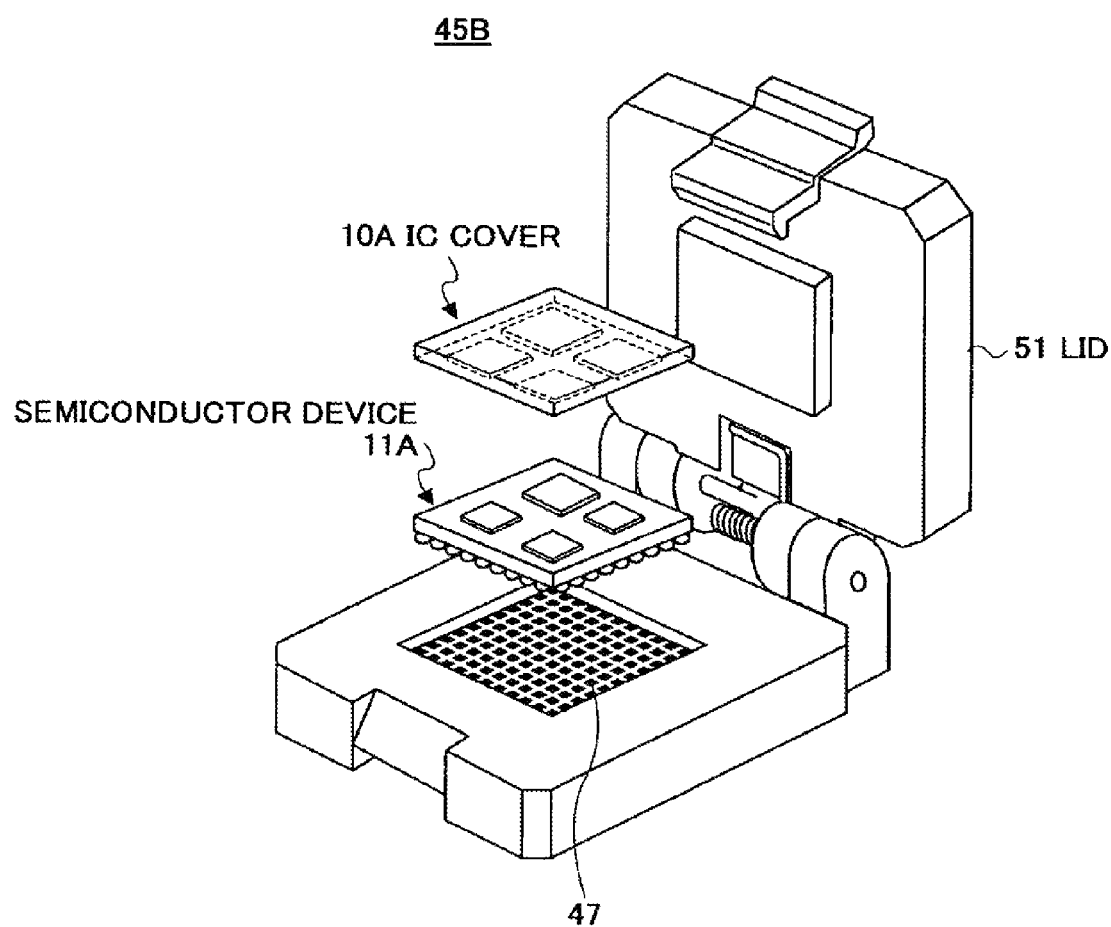
FIG. 6 is a schematic view for explaining the test step continuing from FIG. 5B.

FIG. 6 is a schematic view for explaining the test step S4 continuing from FIG. 5B.

In FIG. 6, the contactor 45B has a lid 51. In this case, the pressing treatment may be conducted by just closing the lid 51. That is, in the present invention, in the pressing treatment, the pressing force is not imposed on the semiconductor device 11A directly, but with the IC cover 10A in between.

Due to this, although the surface of the semiconductor device 11A is uneven due to existence of the semiconductor chips 14, because the top surface of the IC cover mounted on the semiconductor device 11A is flat, the semiconductor device 11A can be uniformly pushed toward the contactor 45A or 45B despite the uneven surface thereof. Hence, the unbalanced load problem in the related art does not occur, that is, load applied on the semiconductor chip 11A is not uniform despite unevenness of the surface of the semiconductor device 11A caused by height differences and deviation of mounting positions of the semiconductor chips 14.

As a result, the solder balls 15, which form external connection terminals of the semiconductor device 11A, are in good electrical connection with the corresponding probe pins 48 of the test apparatus, and this enables a reliable performance test. The same effect can be obtained even when the semiconductor chips 14 are sealed by a liquid sealing resin, that is, by means of bonding.

In the above, it is described that the IC cover 10A is attached to the semiconductor device 11A in advance, and the assembled semiconductor device unit 12A is the object of the performance test in the test step S4. However, the semiconductor device 11A may be mounted in the contactor 45A beforehand as shown in FIG. 5A, and then the IC cover 10J be attached to the semiconductor device 11A as shown in FIG. 5B, and under this condition, the set of the IC cover 10J and the semiconductor device 11A are pressed. In this case, in order to precisely position the IC cover 10J on the semiconductor device 11A, it is preferable that a guide 50 be provided.

Next, an example of the packaging step S6 and the shipment step S7 is explained in which multiple semiconductor devices 11A are packaged into a tray 55.

Figure 7:
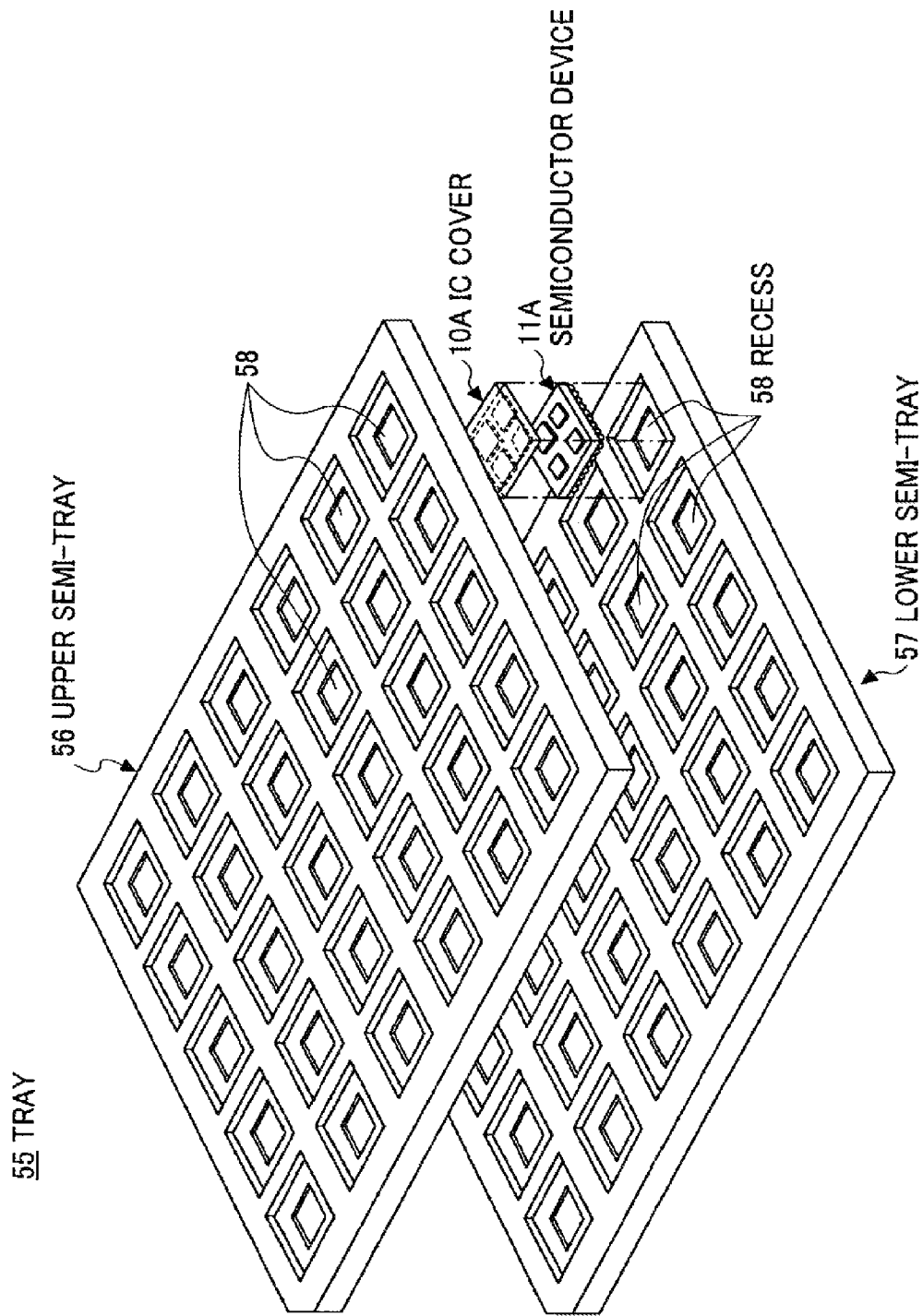
FIG. 7 is a perspective view of a tray 55 used for packaging the semiconductor devices 11A according to the first embodiment of the present invention.

FIG. 7 is a perspective view of a tray 55 used for packaging the semiconductor devices 11A.

To package the semiconductor devices 11A, the semiconductor devices 11A are accommodated between an upper semi-tray 56 and a lower semi-tray 57. Specifically, in the upper semi-tray 56 and the lower semi-tray 57, recesses 58 are formed in a matrix manner, and one of the semiconductor devices 11A is accommodated in the room formed by each recess 58.

The upper semi-tray 56 and the lower semi-tray 57 have the same structure, but for clarity of explanation, the semi-tray at a higher position in FIG. 7 is referred to as "upper semi-tray 56", the semi-tray at a lower position in FIG. 7 is referred to as "lower semi-tray 57", and the combination of the upper semi-tray 56 and the lower semi-tray 57 is referred to as "tray 55" used for packaging the semiconductor devices 11A.

As mentioned above, the semiconductor devices 11A are accommodated between an upper semi-tray 56 and a lower semi-tray 57, thereby, the semiconductor devices 11A are packaged. In the present invention, a semiconductor device 11A is packaged and shipped with an IC cover 10A being attached to the semiconductor device 11A, or in FIG. 7, the IC cover 10A is arranged between the upper semi-tray 56 and the top surface of the semiconductor device 11A, and further the height of the room for accommodating the semiconductor device unit 12A between the upper semi-tray 56 and the lower semi-tray 57 is adjusted to fit the height of the semiconductor device unit 12A, that is, the height of the semiconductor device 11A increased by the height of the IC cover 10A. Due to this, each semiconductor device 11A is firmly packaged in a recess 58 and does not move at all.

Even when the aforesaid unbalanced load problem takes place during packaging and shipment, that is, even when the tray 55 is shaken during transportation after the shipment step S7, the vibration is received by the IC cover 10A, therefore, the there is no damage to the semiconductor device 11A.

Next, another example of the packaging step S6 and the shipment step S7 is explained in which the semiconductor devices 11A is packaged using a strip-shaped packaging material.

FIG. 8 is a cross-sectional view for schematically showing packaging of the semiconductor devices 11A using the strip-shaped packaging material.

As shown in FIG. 8, semiconductor devices 11A are accommodated in respective recesses 62 (emboss) formed on an embossed tape 60. Each recess 62 forms a room for accommodating one semiconductor device 11A. A recess 62, in which a semiconductor device 11A is accommodated, is covered by a cover tape 63, thereby packaging the semiconductor device 11A. The embossed tape 60 is a strip-shaped tape wound on a reel 61, and a number of recesses 62 are formed consecutively in the longitudinal direction of the embossed tape 60. The packaged semiconductor devices 11A are shipped with the embossed tape 60 wound on the reel 61.

In the present invention, when packaging the semiconductor devices 11A with the strip-shaped packaging material, an IC cover 10A is placed on each semiconductor device 11A. Due to this, even when the embossed tape 60 is wound on the reel 61 and thereby pressure is applied on the semiconductor devices 11A, the pressure is received by the IC cover, but not directly applied on the semiconductor devices 11A.

Even when the unbalanced load problem takes place during packaging and shipment, that is, even when the embossed tape is shaken during transportation after the shipment step S7, the vibration is received by the IC covers 10A, therefore, the there is no damage to the semiconductor devices 11A.

Figure 9A:
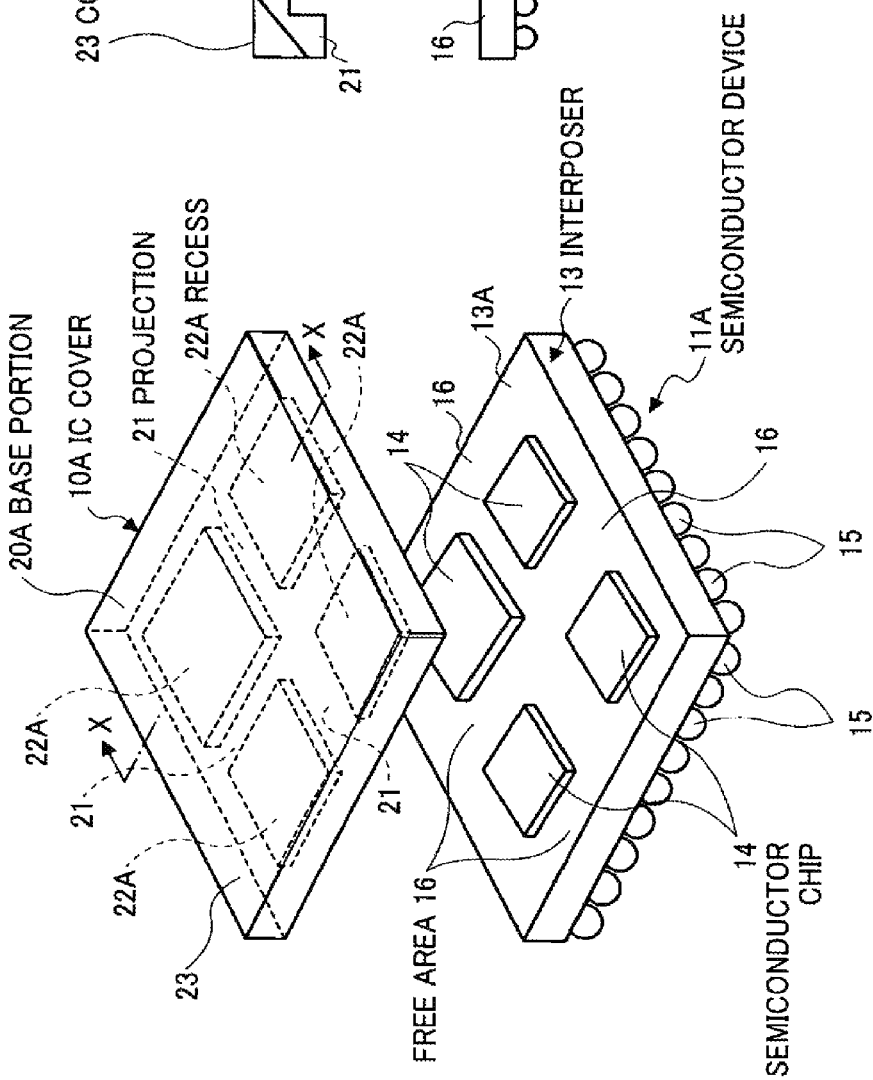
FIG. 9A is a perspective view showing the IC cover 10A according to the first embodiment of the present invention.
Figure 9B:
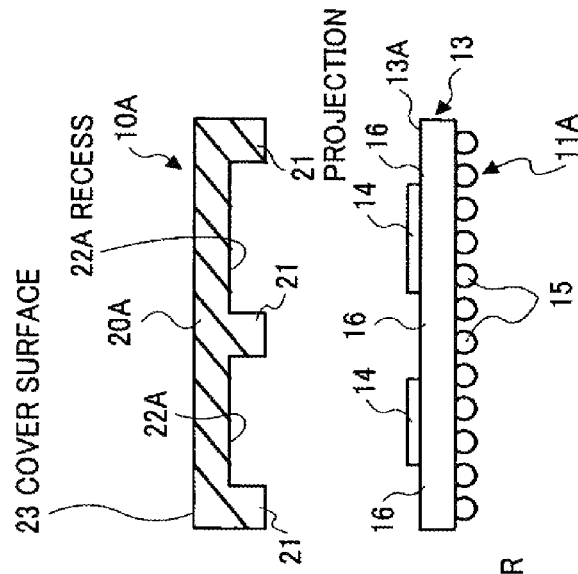
FIG. 9B is a cross-sectional view of the IC cover 10A along a line XX in FIG. 9A.

FIG. 9A is a perspective view showing the IC cover 10A mentioned above. FIG. 9B is a cross-sectional view of the IC cover 10A along a line XX in FIG. 9A.

Figure 10B:
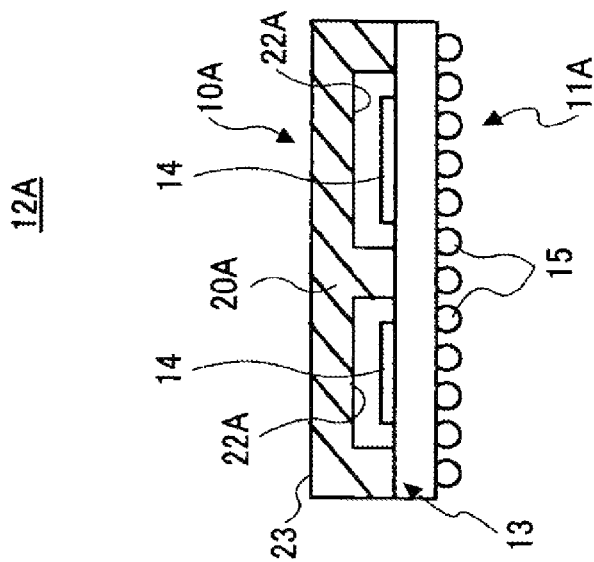
FIG. 10B is a cross-sectional view of the semiconductor device unit 12A along a line XX in FIG. 10A.
Figure 10A:
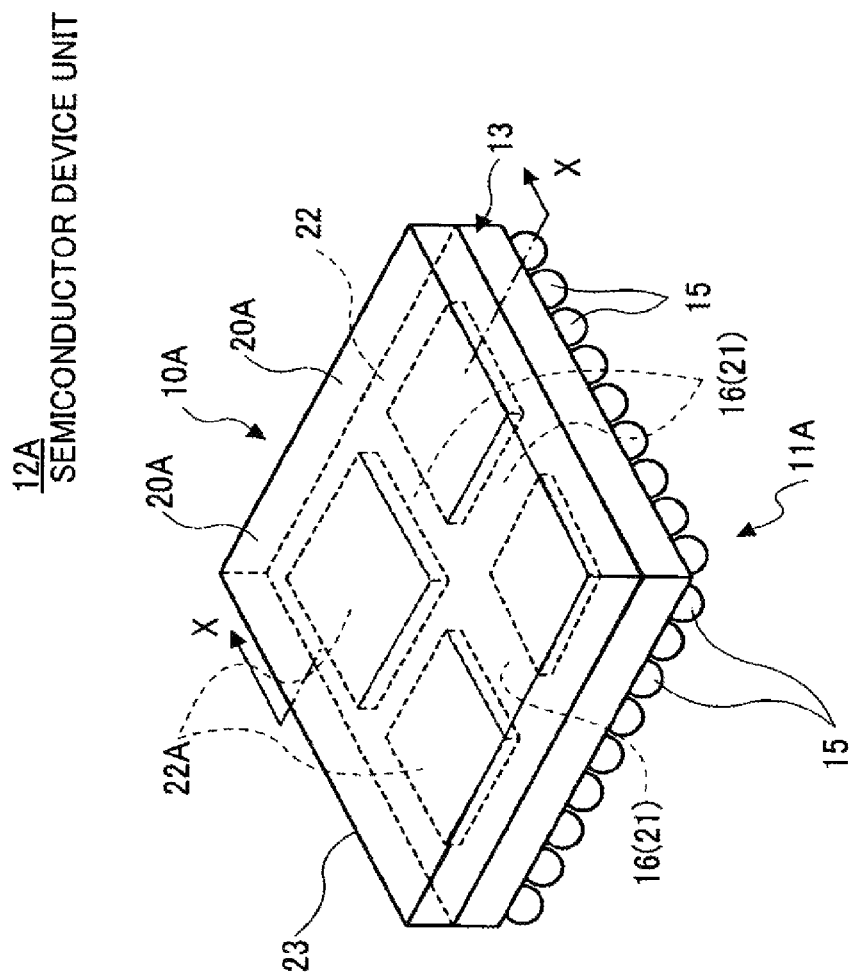
FIG. 10A is a perspective view showing the semiconductor device unit 12A using the IC cover 10A according to the first embodiment of the present invention.

FIG. 10A is a perspective view showing the semiconductor device unit 12A using the IC cover 10A. FIG. 10B is a cross-sectional view of the semiconductor device unit 12A along the line XX in FIG. 10A.

As described above, the semiconductor device 11A of the present invention with the IC cover 10A being attached is a Multi-Chip Module type semiconductor device, and in general, is formed by the interposer 13, one or more semiconductor chips 14, and the solder balls 15.

In the semiconductor device 11A of the present invention, the interposer 13 is a circuit board obtained by stacking one interconnection layer, or more interconnection layers when necessary, onto the surface of an insulating substrate formed from, for example, polyamide. On one surface 13A of the interposer 13, one or more semiconductor chips 14 (there are four chips 14 in the present embodiment) are arranged together with chip condensers, chip resistors, or other electric parts (not illustrated).

The semiconductor chips 14 are bare chips, and mounted and bonded on the interposer 13 by means of "flip chip mounting (face down)". When there are a number of the semiconductor chips 14 mounted, usually the semiconductor chips 14 are of different types, for example, a memory chip, or a logic chip, and so on. For this reason, different semiconductor devices 11A, usually including different chips, have different heights from the surface 13A of the interposer 13.

On the other hand, on the surface 13A of the interposer 13, there are free areas 16 where no semiconductor chip 14 or any other electric part is mounted. These free areas 16 can be touched by other objects. Specifically, a projection 21 (described below) of the IC cover 10A may be in contact with the free areas 16 without any adverse influence.

It should be noted that in fact not all areas where no semiconductor chip 14 or no electric part is mounted belong to the free areas 16. For example, in areas where interconnections are formed at a high density, contacting of the projection 21 with the areas is not desirable. In the present embodiment, just for illustration, all areas where no semiconductor chip 14 or no electric part is mounted belong to the free areas 16.

Further, on the rear surface of the interposer 13, a number of the solder balls 15 are formed. The solder balls 15 function as external connection terminals of the semiconductor device 11A, and are electrically connected to the semiconductor chips 14 through interconnection layers in the interposer 13. Such a semiconductor device 11A is assembled by well known semiconductor fabrication techniques, and this corresponds to the assembly step S1 in FIG. 1.

The IC cover 10A of the present invention is attached to the assembled semiconductor device 11A. Next, the structure of the IC cover 10A is described in detail.

For example, the IC cover 10A is formed from resins, such as PES (Poly Ether Sulphone), or PEI (Poly Ether Imide), with glass materials added. As shown in FIGS. 9A and 9B, the IC cover 10A includes a base portion 20A and a projection 21 integral with the base portion 20A.

The base portion 20A is plate-shaped; the shape and size of the plate are set to be roughly the same as those of the surface 13A of the interposer 13 of the semiconductor device 11A. In addition, the top surface of the IC cover 10A (referred to as cover surface 23) is a flat plane without any unevenness.

One the other principal surfaces of the base portion 20A, depressed portions are formed to fit size, shapes, numbers and positions of the semiconductor chips 14 and other electric parts mounted in the semiconductor device 11A. These depressed portions correspond to the recesses 22A for accommodating the semiconductor chips 14 and other electric parts. The portions of the base 20A around the recesses forms the projections 21, and after the IC cover 10A is attached to the semiconductor device 11A, the projections 21 act as a connector in contact with the surface 13A of the interposer 13 of the semiconductor device 11A.

In the IC cover 10A, the depths of the recesses 22A are set greater than the thickness of the semiconductor chips 14 to be accommodated, in other words, greater than the height of the accommodated semiconductor chips 14. Therefore, there is an interval between the top of a recess 22A and the top of an accommodated semiconductor chip 14. This interval prevents the base portion 20A from contacting the accommodated semiconductor chip 14 during transportation or a test of the semiconductor device 11A.

Similarly, when chip condensers, chip resistors, or other electric parts are mounted on the surface 13A of the interposer 13, on surfaces of the IC cover 10A, recesses are formed to accommodate the chip condensers, chip resistors, or other electric parts, the depths of the recesses are set greater than the height of the accommodated chip condensers, chip resistors, or other electric parts. For even smaller electric parts, a number of them may be accommodated in a common recess.

As shown in FIG. 9A and FIG. 9B, when the projection 21 on the IC cover 10A is positioned to face one of the free areas 16 on the interposer 13 of the semiconductor device 11A, as shown in FIG. 10A and FIG. 10B, the IC cover 10A is attached to the semiconductor device 11A. Under this condition, the projection 21 of the IC cover 10A is in contact with the free areas 16 on the interposer 13 of the semiconductor device 11A, thereby the IC cover 10A is set in position on the semiconductor device 11A.

As shown in FIG. 10B, the inner surface of the recess 22A is separated from the accommodated semiconductor chip 14. With the separation, direct application of an external force to the semiconductor chip 14 is prevented even when the external force is imposed on the IC cover 10A. The semiconductor device 11A and the IC cover 10A attached to the semiconductor device 11A form the semiconductor device unit 12A.

In addition, in the semiconductor device unit 12A, because the IC cover 10A is just placed on the semiconductor device 11A, the IC cover 10A can be easily detached.

As mentioned above, when the IC cover 10A is attached to the semiconductor device 11A, the base portion 20A of the IC cover 10A covers the semiconductor device 11A. Thus, when an external force is imposed on the semiconductor device unit 12A, the external force is absorbed and weakened by the IC cover 10A. This prevents direct application of the external force to the semiconductor chip 14, which has a lower mechanical strength than that of the interposer 13, and thereby prevents the semiconductor device 11A.

As mentioned above, the projection 21 of the IC cover 10A is in contact with a selected free area 16 of the interposer 13; this selected free area 16 has a lower density of the semiconductor chips 14, electric parts and interconnections. Thus, even when the projection is in contact with the interposer 13, this does not cause any damage to the interposer 13 or in turn, to the semiconductor device 11A.

As mentioned above, the IC cover 10A is detachably attached to the semiconductor device 11A, thus, the IC cover 10A can be removed easily from the semiconductor device 11A when necessary, for example, the protection for the semiconductor device 11A is not necessary when mounting the semiconductor device 11A.

In addition, although not illustrated in FIGS. 9A and 9B and FIGS. 10A and 10B, the suction hole 38 as shown in FIG. 2, through which the suction head 40 takes suction on the IC cover 10A and the semiconductor device 11A together during the transportation step S3 or S5 in FIG. 1, may be appropriately formed near the center of the IC cover 10A.

In addition, in the present embodiment, for example, the IC cover 10A and the interposer 13 are both formed from resins having similar hardness. However, the IC cover 10A may be formed from materials having greater hardness than that of the surface 13A of the interposer 13 of the semiconductor device 11A.

For example, the IC cover 10A may be formed from engineering plastic materials having high hardness, such as, metals, ceramics, or PBI (Poly Benz Imidazole). Because the IC cover 10A is hard, the IC cover 10A has a high resistance against external forces, and the semiconductor device 11A and the semiconductor chips 14 therein can be reliably protected.

On the other hand, the IC cover 10A may also be formed from materials having lower hardness than the surface 13A of the interposer 13 of the semiconductor device 11A. Because the IC cover 10A is soft, the IC cover 10A can hardly cause damage to the surface 13A of the interposer 13 of the semiconductor device 11A.

In the above, it is described that as the semiconductor chips 14, bare chips are mounted on the interposer 13 in the semiconductor device 11A; certainly, the present invention is applicable even when mounting semiconductor chips sealed by resins.

For semiconductor chips sealed by resins, when different kinds of chips are mounted on the interposer, unevenness of chips' heights occurs on the interposer, and due to this, uniform connection with the probe pins cannot be obtained in the test step.

According to the present invention, using an IC cover formed with recesses for accommodating the resin-sealed semiconductor chips, the above problem can be solved. When both the bare chips and the resin-sealed chips are present, in the same way, unevenness of chips' heights occurs on the interposer. This problem can also be solved by applying an IC cover according to the present invention.

In addition, as shown in FIG. 1, after the IC cover 10A is attached to the semiconductor device 11A in the step S2, the transportation steps S3 and S5, the test step S4, the packaging step S6, and the shipment step S7 are executed.

Second Embodiment

Figure 11:
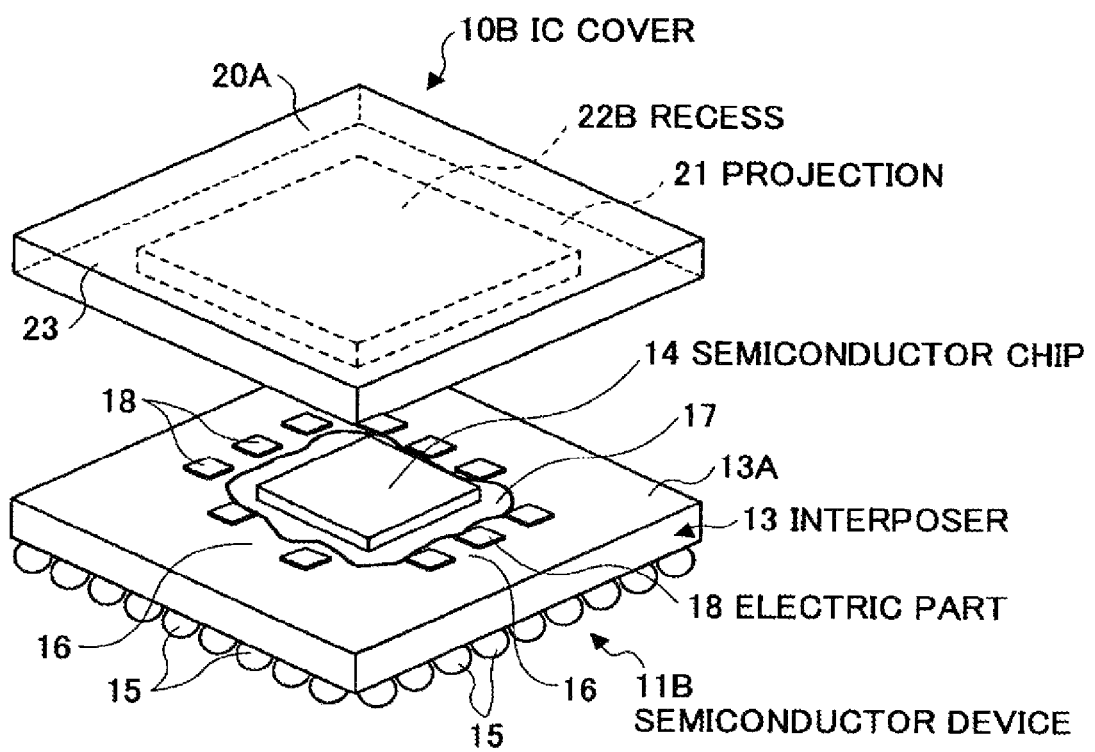
FIG. 11 is a perspective view of an IC cover 10B and a semiconductor device 11B according to a second embodiment.

FIG. 11 is a perspective view of an IC cover 10B and a semiconductor device 11B according to a second embodiment. In FIG. 11, the same reference numbers are used for the same elements as those shown in the preceding embodiment.

As shown in FIG. 11, the IC cover 10B is attached to the semiconductor device 11B.

In the semiconductor device 11B, a semiconductor chip 14 and a number of electric parts 18 (for example, chip condensers) are mounted on a surface 13A of an interposer 13. The semiconductor chip 14 is connected to the interposer 13 by means of flip chip mounting (face down); an under-fill material 17 is provided between the semiconductor chip 14 and the interposer 13 to improve the connection reliability. The under-fill material 17 extends until the peripheral area of the semiconductor chip 14. The electric parts 18 are arranged in proximity of the semiconductor chip 14, to surround the semiconductor chip 14.

The semiconductor chip 14 and the electric parts 18 have different heights relative to the surface 13A. Due to this, even in the second embodiment, the surface 13A of the semiconductor device 11B has unevenness.

The IC cover 10B, the same as the preceding embodiment, includes a projection 21 and a recess 22B. In the recess 22B, all of the semiconductor chip 14 and the electric parts 18 are accommodated. In other words, the shape of the recess 22B need not be made in correspondence to the shape of the semiconductor chip 14 and shapes of the electric parts 18; the shape of the recess 22B can be determined appropriately according to the lay-out of the semiconductor chip 14 and the electric parts 18. However, the position of the recess 22B should ensure that the base portion 20A of the IC cover 10B can be well supported by the projection 21.

Although not illustrated in FIG. 11, a suction hole 38 as shown in FIG. 2, through which a suction head 40 takes suction on the IC cover 10B and the semiconductor device 11B together during the transportation step S3 or S5 in FIG. 1, may be appropriately formed near the center of the IC cover 10B.

Third Embodiment

Figure 12:
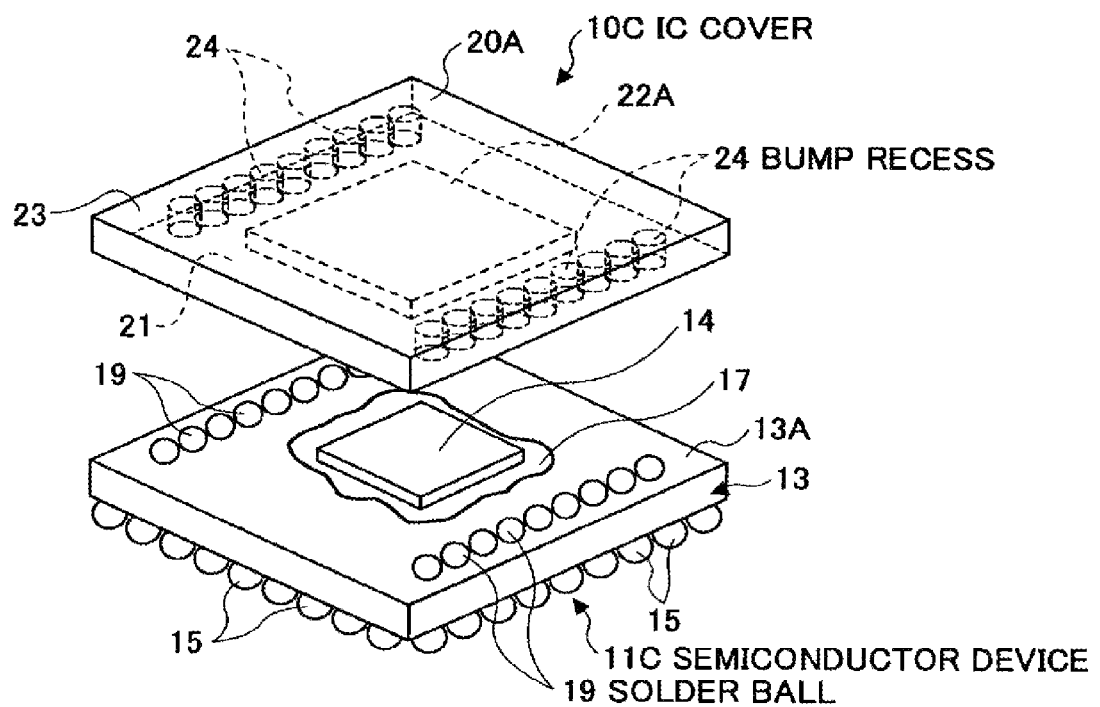
FIG. 12 is a perspective view of an IC cover 10C and a semiconductor device 11C according to a third embodiment.

FIG. 12 is a perspective view of an IC cover 10C and a semiconductor device 11C according to a third embodiment. In FIG. 12, the same reference numbers are used for the same elements as those shown in the preceding embodiments.

As shown in FIG. 12, the IC cover 10C is attached to the semiconductor device 11C.

In the semiconductor device 11C, a semiconductor chip 14 and solder balls 19 for stacking are arranged on a surface 13A of an interposer 13.

The semiconductor device 11C is obtained by stacking other not-illustrated semiconductor devices when mounting the semiconductor device 11C. Therefore, in addition to the solder balls 15 on the lower surface of the interposer 13, the solder balls 19 are also prepared on the upper surface for use in stacking.

For this reason, on the IC cover 11C attached to the semiconductor device 11C, in addition to a recess 22 in correspondence to the position of the semiconductor chip 14, bump recesses 24 are also formed at positions in correspondence to positions of the solder balls 19. As shown in FIG. 12, the bump recesses 24 correspond to the solder balls 19, respectively, and are formed along a line so as to accommodate the solder balls, which are arranged in a line, too, at the same time.

With such an IC cover 10C, when it is attached to the semiconductor device 11C, the solder balls 19 are accommodated in the bump recesses 24, respectively, therefore, even if an external force is applied on the IC cover 10C, the solder balls 19 do not receive the force and do not deform, and this protects the semiconductor device 11C.

Although not illustrated in FIG. 12, a suction hole 38 as shown in FIG. 2, through which a suction head 40 takes suction on the IC cover 10C and the semiconductor device 11C together during the transportation step S3 or S5 in FIG. 1, may be appropriately formed near the center of the IC cover 10C.

Fourth Embodiment

FIG. 13A is a perspective view of the IC cover 10A and the semiconductor device 11A as shown in the first embodiment.

FIG. 13B is a cross-sectional view of the IC cover 10A and the semiconductor device 11A along the line XX in FIG. 13A.

That is, the IC cover 10A has roughly the same size of the interposer 13 of the semiconductor device 11A, and the shape of the IC cover 10A is in correspondence to the outer shape of the semiconductor device 11A.

FIG. 13C is a perspective view of an IC cover 10D and a semiconductor device 11D according to a fourth embodiment.

FIG. 13D is a cross-sectional view of the IC cover 10D and the semiconductor device 11D along the line XX in FIG. 13C.

In this embodiment, despite the difference between the outer shapes of the semiconductor device 11A and the semiconductor device 11D, the outer shape and size of the base portion 20A of the IC cover 10A are the same as those of the base portion 20G of the IC cover 10A. It should be noted that although only two kinds of semiconductor devices 11A and 11D are presented as an example, the present invention is applicable to more kinds of semiconductor devices, that is, an IC cover that has a unified outer shape and size can be used for many kinds of semiconductor devices having different shapes and sizes.

According to the present embodiment, even when the outer shapes of semiconductor devices are different, by using an IC cover having a unified outer shape and size, semiconductor device units having the same outer shape and size can be obtained. Due to this, when transporting semiconductor devices by holding a protection cover, it is possible to transport various kinds of semiconductor devices by the same conveying arm despite the different shapes and sizes of the semiconductor devices. As a result, it is possible to unify apparatuses for semiconductor device processing, and reduce device cost.

Although not illustrated in FIGS. 13C and 13D, a suction hole 38 as shown in FIG. 2, through which a suction head 40 takes suction on the IC cover 10D and the semiconductor device 11D together during the transportation step S3 or S5 in FIG. 1, may be appropriately formed near the center of the IC cover 10D.

Fifth Embodiment

Figure 14A:
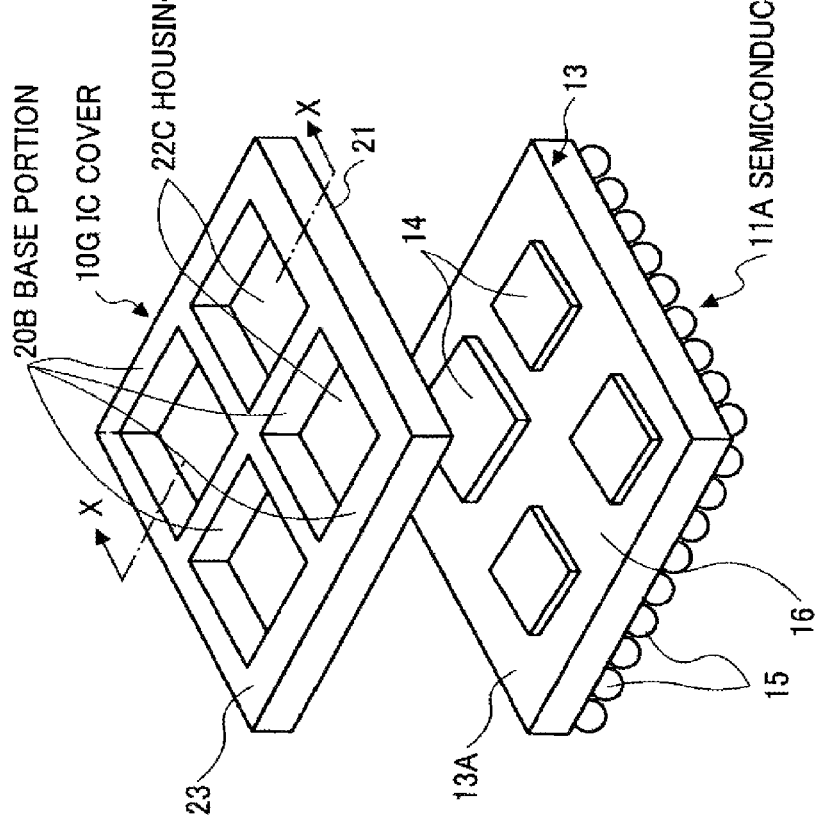
FIG. 14A is a perspective view of an IC cover 10G according to a fifth embodiment.

FIG. 14A is a perspective view of an IC cover 10G according to a fifth embodiment.

Figure 14B:
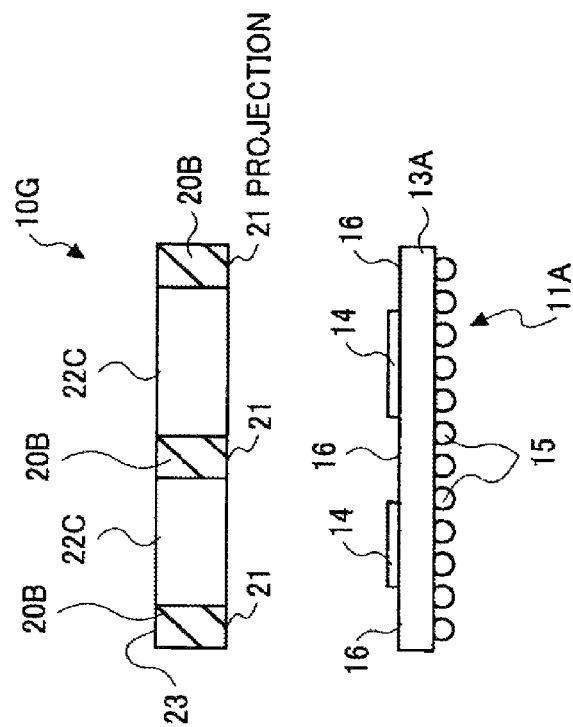
FIG. 14B is a cross-sectional view of the IC cover 10G along the line XX in FIG. 14A.

FIG. 14B is a cross-sectional view of the IC cover 10G along the line XX in FIG. 14A.

Figure 15B:
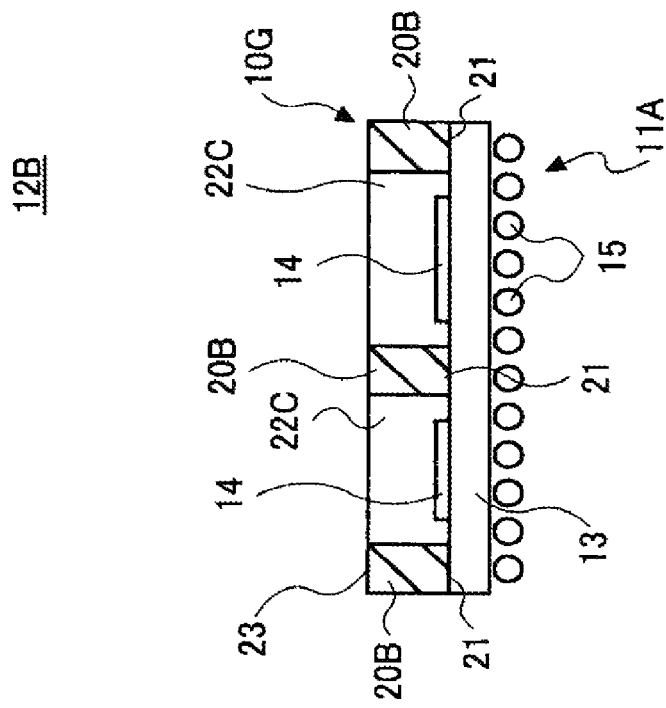
FIG. 15B is a cross-sectional view of the semiconductor device unit 12B along the line XX in FIG. 15A.
Figure 15A:
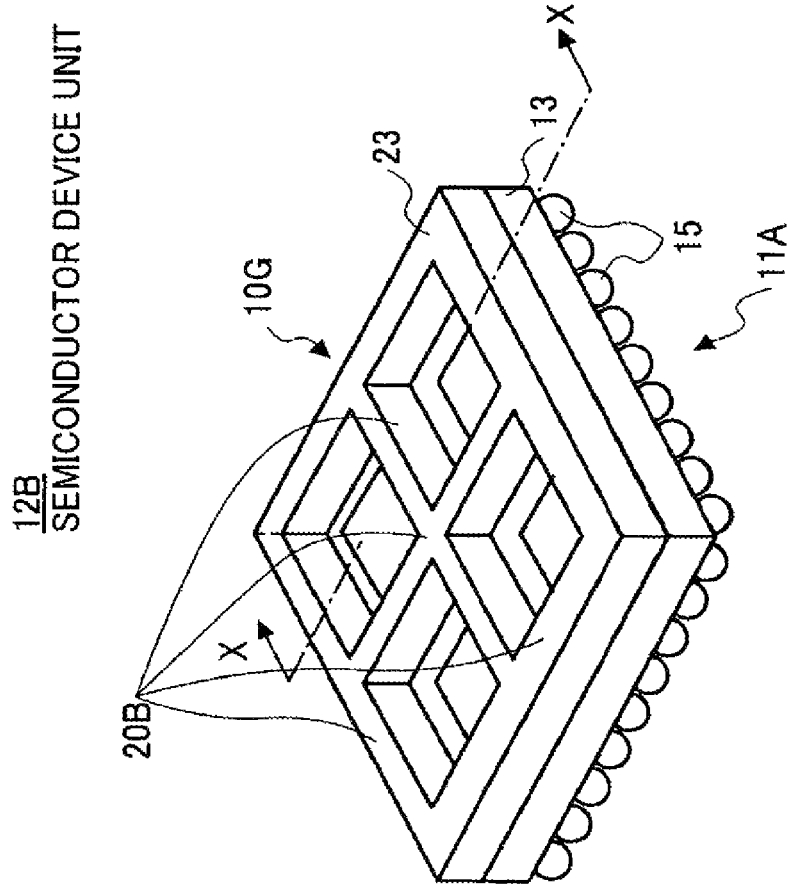
FIG. 15A is a perspective view of a semiconductor device unit 12B according to the fifth embodiment.

FIG. 15A is a perspective view of a semiconductor device unit 12B according to the fifth embodiment.

FIG. 15B is a cross-sectional view of a semiconductor device unit 12B along the line XX in FIG. 15A.

In this embodiment, the same reference numbers are used for the same elements as those shown in the preceding embodiments.

As shown in FIGS. 14A and 14B, and FIGS. 15A and 15B, the IC cover 10G is attached to the semiconductor device 11A, forming the semiconductor device unit 12B.

In the present embodiment, the IC cover 10G has housings 22C that are openings penetrating the IC cover 10G, the base portion 20B is like a pier, and the projection 21 is identical to the base portion 20B.

As shown in FIGS. 14A and 14B, the housings 22C of the IC cover 10G are positioned to face the semiconductor chips 14 of the semiconductor device 11A, and in this state, the IC cover 10G is attached to the semiconductor device 11A, as shown in FIGS. 15A and 15B. In this state, because the housings 22C are openings penetrating the IC cover 10G, an operator can view by eye the semiconductor chips 14 of the semiconductor device 11A through the housings 22C from the upper side, hence, it becomes easy to precisely position the IC cover 10G and the semiconductor device 11A.

By attaching the IC cover 10G to the semiconductor device 11A, the semiconductor device unit 12B is obtained. Under this mounting state, the projection 21 of the IC cover 10G is in contact with the free area 16 of the semiconductor device 11A.

In the present embodiment, the base portion 20B is integral with the projection 21, but the projection 21 supports the base portion 20B, and receives an external force applied to the base portion 20B.

In the present embodiment, because the housings 22 are openings penetrating the IC cover 10G, in addition to the aforesaid improvement in positioning, it is also possible to reduce cost of materials and weight of the IC cover 10G.

Sixth Embodiment

Figure 16B:
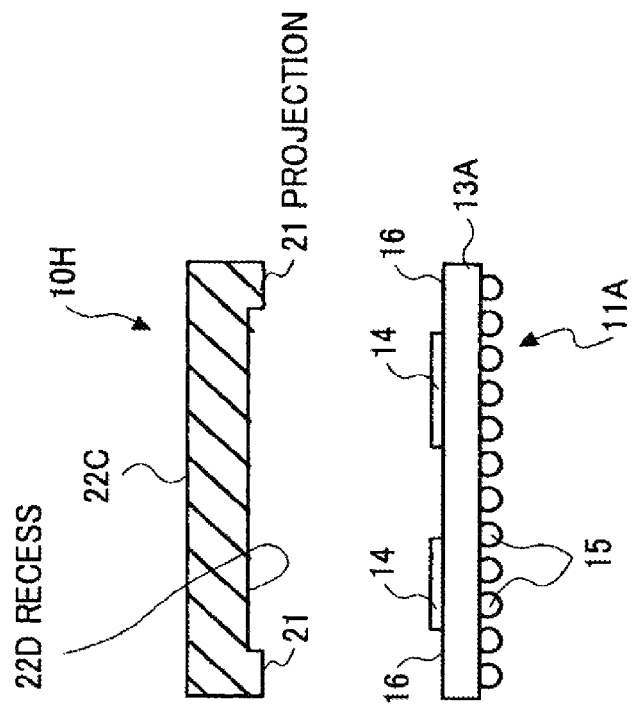
FIG. 16B is a cross-sectional view of the IC cover 10H along the line XX in FIG. 16A.
Figure 16A:
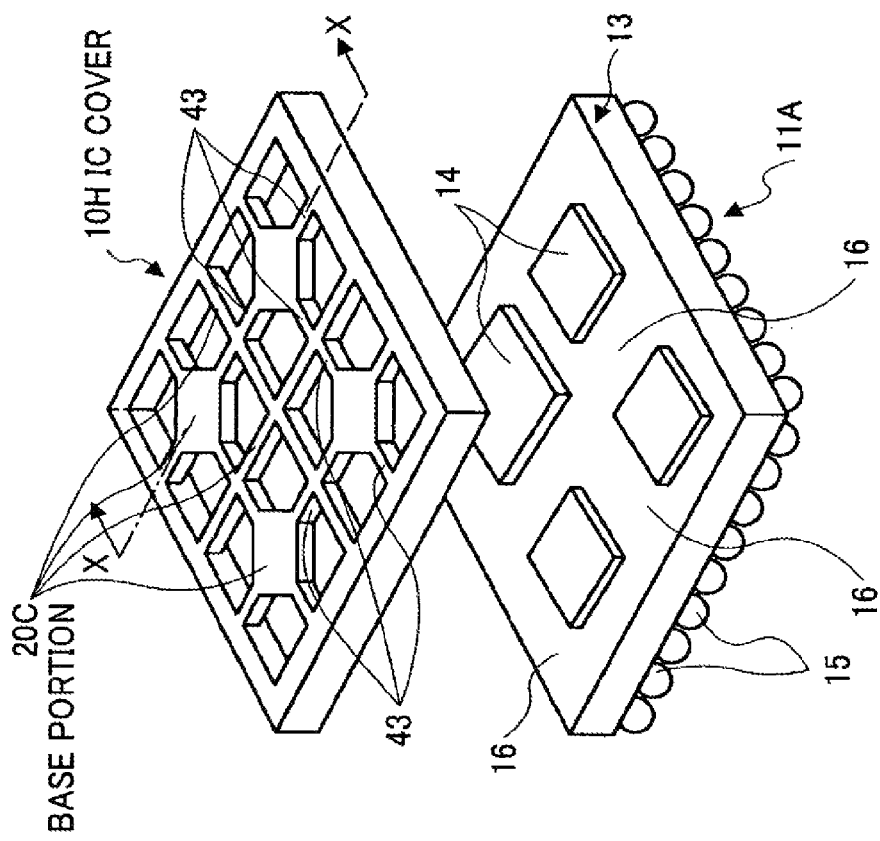
FIG. 16A is a perspective view of an IC cover 10H according to a sixth embodiment.

FIG. 16A is a perspective view of an IC cover 10H according to a sixth embodiment.

FIG. 16B is a cross-sectional view of the IC cover 10H along the line XX in FIG. 16A.

Figure 17A:
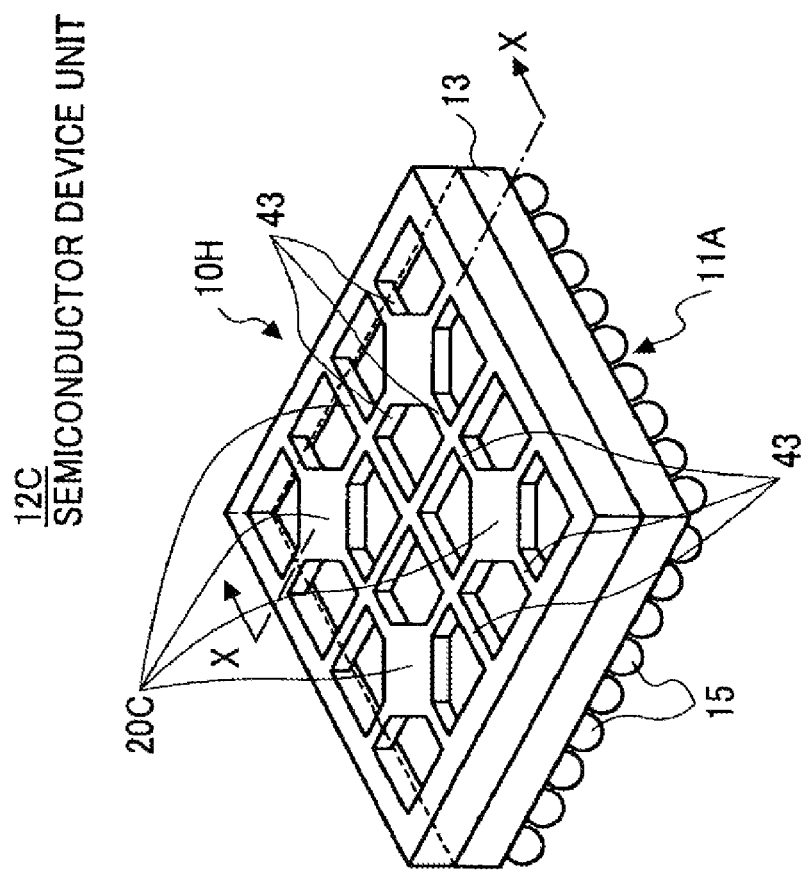
FIG. 17A is a perspective view of a semiconductor device unit 12C according to the sixth embodiment.

FIG. 17A is a perspective view of a semiconductor device unit 12C according to the sixth embodiment.

Figure 17B:
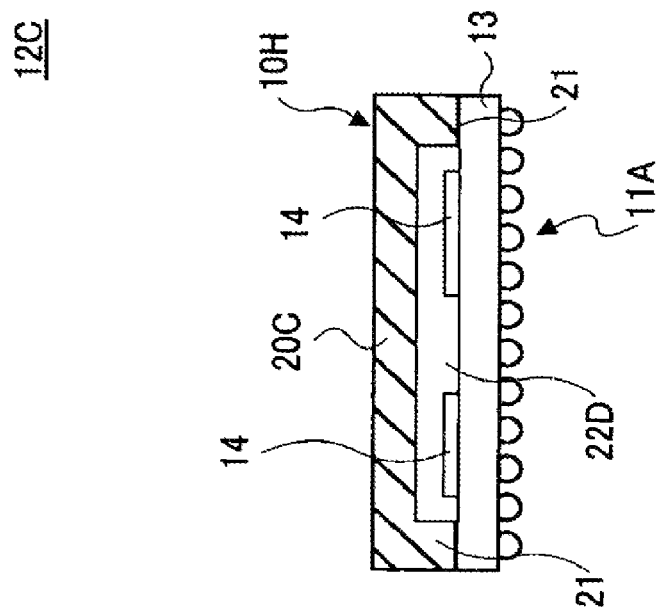
FIG. 17B is a cross-sectional view of a semiconductor device unit 12C along the line XX in FIG. 17A.

FIG. 17B is a cross-sectional view of a semiconductor device unit 12C along the line XX in FIG. 17A.

In this embodiment, the same reference numbers are used for the same elements as those shown in the preceding embodiments.

As shown in FIGS. 16A and 16B, and FIGS. 17A and 17B, the IC cover 10H is attached to the semiconductor device 11A, forming the semiconductor device unit 12C.

In the present embodiment, the IC cover 10H has ribs 43, which are connected to the base portion 20C and form the top of the housings 22D.

The upper surface of the base portion 20D including the ribs 43 is a flat plane. As shown in FIGS. 16A and 16B, the housings 22D of the IC cover 10H are positioned to face the semiconductor chips 14 of the semiconductor device 11A, and in this state, the IC cover 10G is attached to the semiconductor device 11A, as shown in FIGS. 17A and 17B.

In this state, because of the rib-structure of the IC cover 10H, the IC cover 10H is partially opened, therefore an operator can view by eye the semiconductor chips 14 of the semiconductor device 11A through the openings from the upper side; hence, it becomes easy to precisely position the IC cover 10H and the semiconductor device 11A.

By attaching the IC cover 10H to the semiconductor device 11A, the semiconductor device unit 12C is obtained. Under this mounting state, the projection 21 of the IC cover 10H is in contact with the free area 16 of the semiconductor device 11A; therefore, the base portion 20C is supported by the projection 21 above the interposer 13.

In addition, in the present embodiment, because ribs 43 are formed as a portion of the housings 22D, the mechanical strength of the IC cover 10H is high compared to the IC cover 10G in the preceding embodiment. Therefore, the IC cover 10H is able to more effectively prevent damage to the semiconductor device 11A when an external force is imposed on the semiconductor device 11A. Further, it is also possible to reduce cost of materials and weight of the IC cover 10H compared with the IC covers 10A through 10G.

Seventh Embodiment

In this embodiment, a mechanism for positioning an IC cover relative to a semiconductor device is explained.

In the present embodiment, a first positioning member is formed on the semiconductor device, and a second positioning member is formed on the IC cover; the semiconductor device and the IC cover are set in position when the first positioning member and the second positioning member are engaged with each other.

In this embodiment, the same reference numbers are used for the same elements as those in the preceding embodiments.

FIG. 18A is a perspective view of an IC cover 10E and a semiconductor device 11E, as a first example according to a seventh embodiment. The IC cover 10E and the semiconductor device 11E form a semiconductor device unit 12D.

In FIG. 18A, a selected corner of the semiconductor device 11E is cut away, forming a positioning side 26 in the semiconductor device 11E, as the first positioning member. Meanwhile, a positioning column 25 is formed on the IC cover 10E, as the second positioning member. That is, the positioning side 26 is obtained by cutting a selected corner of the interposer 13, and the positioning column 25 is obtained by extending downward a selected corner of the IC cover 10E.

The positioning side 26 and the positioning column 25 are formed in corresponding positions. Thus, by making positions of the positioning side 26 and the positioning column 25 in agreement with each other, the IC cover 10E can be precisely positioned relative to the semiconductor device 11E, and the IC cover 10E can be attached to the semiconductor device 11E under this positioning condition. Hence, positioning of the IC cover 10E can be conducted easily and reliably.

FIG. 18B is a perspective view of an IC cover 10F and a semiconductor device 11F, as a second example according to the seventh embodiment. The IC cover 10F and the semiconductor device 11F form a semiconductor device unit 12E.

In FIG. 18B, a positioning mark 28 is formed at a selected corner of the semiconductor device 11E as the first positioning member, and a positioning mark 27 is formed on the IC cover 10F as the second positioning member.

The positioning mark 28 is on the surface of interposer 13 and is formed from a metal film; the positioning mark 27 is an opening penetrating the base portion 20A of the IC cover 10F.

The positioning mark 28 and the positioning mark 27 are formed in corresponding positions. Thus, by making positions of the positioning mark 28 and the positioning mark 27 in agreement with each other, the IC cover 10F can be precisely positioned relative to the semiconductor device 11F, and the IC cover 10F can be attached to the semiconductor device 11F under this positioning condition. Hence, positioning of the IC cover 10F can be conducted easily and reliably.

Figure 19:
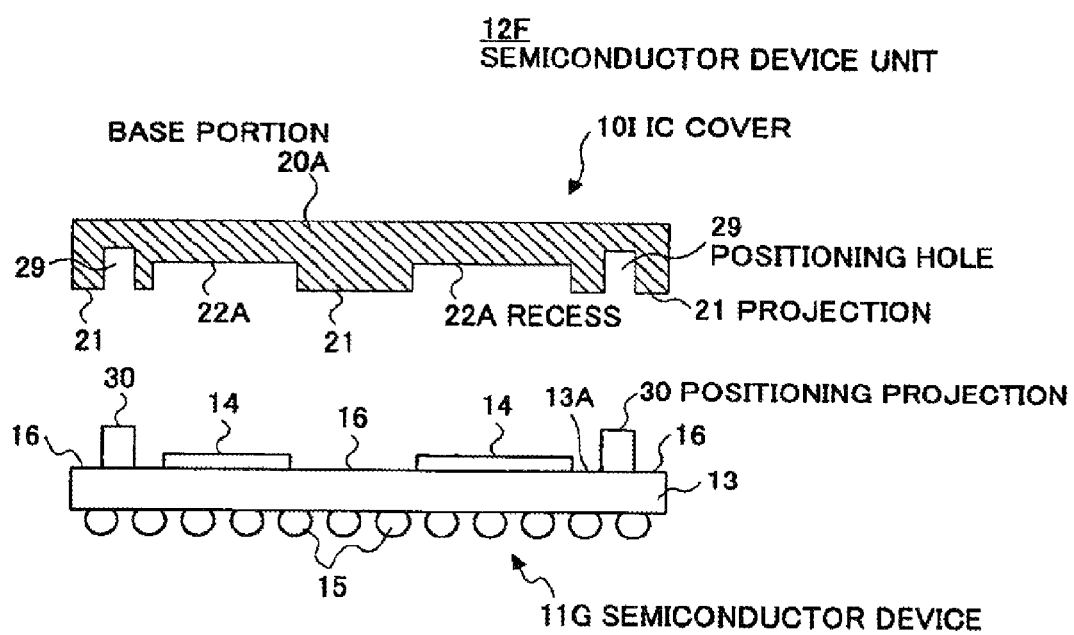
FIG. 19 is a cross-sectional view of an IC cover 10I and a semiconductor device 11G, as a third example according to the seventh embodiment. The IC cover 10I and the semiconductor device 11G form a semiconductor device unit 12F.

FIG. 19 is a cross-sectional view of an IC cover 10I and a semiconductor device 11G, as a third example according to the seventh embodiment. The IC cover 10I and the semiconductor device 11G form a semiconductor device unit 12F.

In FIG. 19, one or more positioning projections 30 are formed on the semiconductor device 11G as the first positioning member; and one or more positioning holes 29 are formed on the IC cover 10I as the second positioning member.

The positioning projections 30 are formed on the surface of the interposer 13. The positioning projections 30 can be obtained by forming column-like members on the interposer 13, or they can be formed integrally with the interposer 13 when fabricating the interposer 13.

The positioning holes 29 are formed at specified positions of the base portion 20A of the IC cover 10G. The positioning holes 29 can be formed integrally with the IC cover 10I when fabricating the IC cover 10I.

The positioning projections 30 and the positioning holes 29 are formed in corresponding positions. Thus, by making positions of the positioning projections 30 and the positioning holes 29 in agreement with each other, the IC cover 10I can be precisely positioned relative to the semiconductor device 11G, and the IC cover 10I can be attached to the semiconductor device 11G under this positioning condition. Hence, positioning of the IC cover 10I can be conducted easily and reliably.

Figure 20:
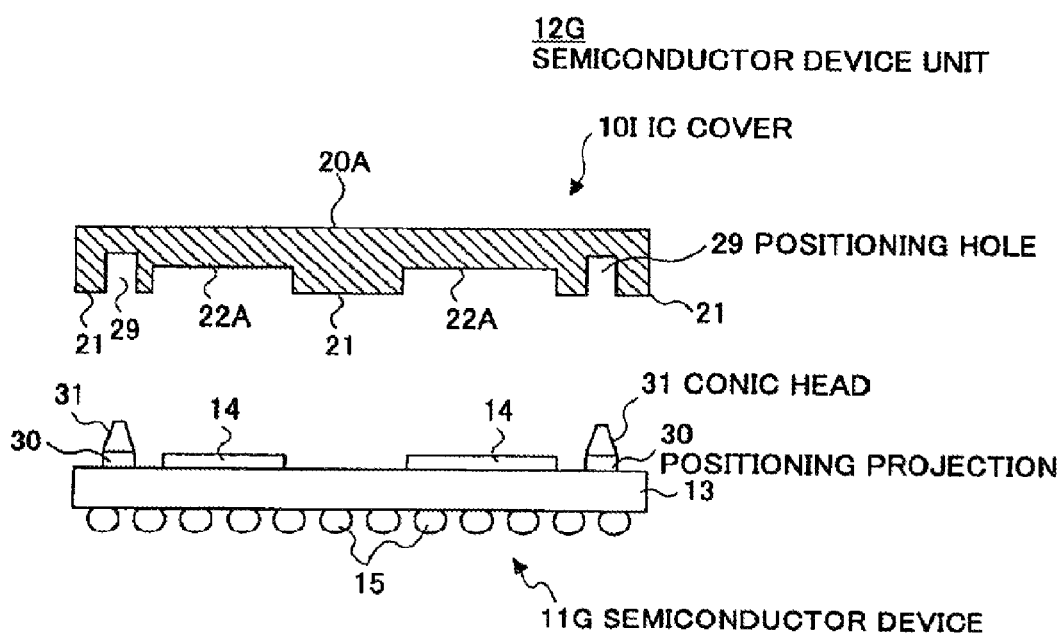
FIG. 20 is a cross-sectional view of an IC cover 10I and a semiconductor device 11G, as a fourth example according to the seventh embodiment. The IC cover 10I and the semiconductor device 11G form a semiconductor device unit 12G.

FIG. 20 is a cross-sectional view of an IC cover 10I and a semiconductor device 11G, as a fourth example according to the seventh embodiment. The IC cover 10I and the semiconductor device 11G form a semiconductor device unit 12G.

The semiconductor device unit 12G shown in FIG. 20 has the same IC cover 10I and the semiconductor device 11G as the semiconductor device unit 12F in FIG. 19, but in the semiconductor device unit 12G, each positioning projection 30 on the semiconductor device 11G has a conic head 31.

Because of the presence of the conic head 31, which has an inclined surface, when attaching the IC cover 10I to the semiconductor device 11G, the conic head 31 guides the positioning projection 30 to be inserted into the corresponding positioning hole 29, hence, it becomes easy to insert the positioning projection 30 into the positioning hole 29.

Figure 21:
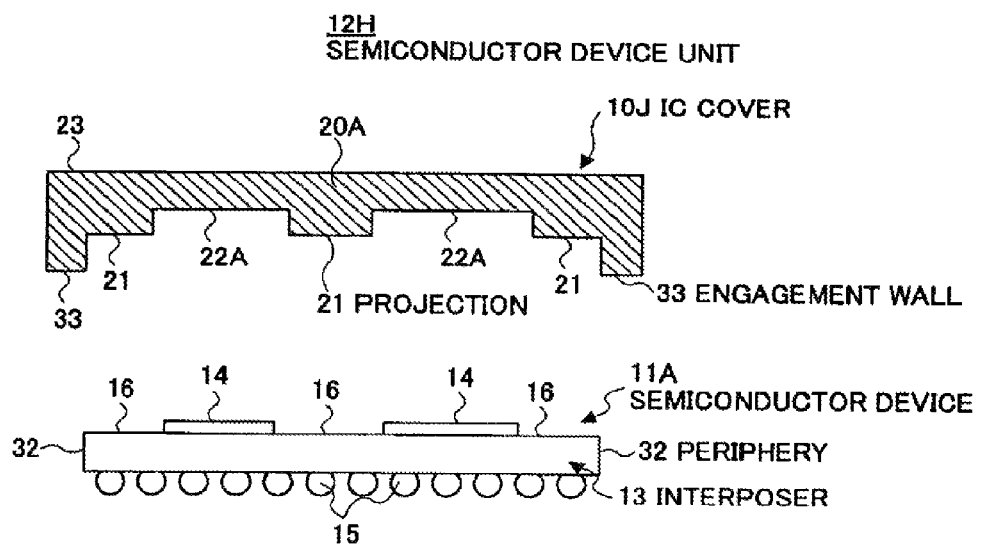
FIG. 21 is a cross-sectional view of an IC cover 10J and the semiconductor device 11A, as a fifth example according to the seventh embodiment. The IC cover 10J and the semiconductor device 11A form a semiconductor device unit 12H.

FIG. 21 is a cross-sectional view of an IC cover 10J and the semiconductor device 11A, as a fifth example according to the seventh embodiment. The IC cover 10J and the semiconductor device 11A form a semiconductor device unit 12H.

In FIG. 21, the peripheral part 32 of the semiconductor device 11A is used as the first positioning member, and an engagement wall 33 is formed on the IC cover 10J as the second positioning member.

The engagement wall 33 is obtained by extending downward the peripheral part of the base portion 20A of the IC cover 10J, and the position of the top of the engagement wall 33 is lower than the position of the projection 21, which is in contact with the free area 16 after being mounted.

The inner side of the engagement wall 33 is formed to have a shape in correspondence to the shape of the outer side of the circumference of the interposer 13. The engagement wall 33 may be formed integrally with the IC cover 10J when fabricating the IC cover 10J.

Because the shape of the inner side of the engagement wall 33 is in correspondence to the shape of the outer side of the circumference of the interposer 13, when the engagement wall 33 is mated with the peripheral part 32 of the interposer 13, the IC cover 10J can be precisely positioned relative to the semiconductor device 11A, and the IC cover 10J can be attached to the semiconductor device 11A under this positioning condition. Hence, positioning of the IC cover 10J can be conducted easily and reliably.

In the semiconductor device unit 12H, because the peripheral part 32 of the interposer 13 of the semiconductor device 11A is used as the first positioning member, it is not necessary to provide additional parts for positioning.

Figure 22:
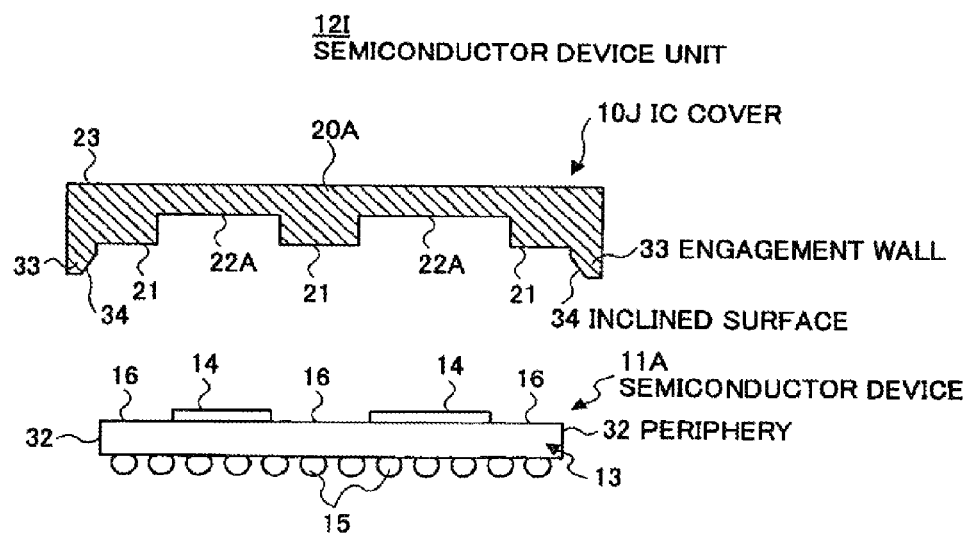
FIG. 22 is a cross-sectional view of the IC cover 10J and the semiconductor device 11A, as a sixth example according to the seventh embodiment. The IC cover 10J and the semiconductor device 11A form a semiconductor device unit 12I.

FIG. 22 is a cross-sectional view of the IC cover 10J and the semiconductor device 11A, as a sixth example according to the seventh embodiment. The IC cover 10J and the semiconductor device 11A form a semiconductor device unit 12I.

The semiconductor device unit 12I shown in FIG. 22 has the same IC cover 10J and the semiconductor device 11A as the semiconductor device unit 12H in FIG. 21, but in the semiconductor device unit 12I, the engagement wall 33 has an inclined surface 34 on the inner side thereof.

Because of the presence of the inclined surface 34, when attaching the IC cover 10J to the semiconductor device 11A, the inclined surface 34 guides the engagement wall 33 to mate with the peripheral part 32 of the interposer 13, hence, it becomes easy to engage the IC cover 10J with the interposer 13.

Although it is not mentioned in the above descriptions, and not illustrated in FIG. 18A through FIG. 22, the suction hole 38 as shown in FIG. 2, through which the suction head 40 takes suction on the IC cover 10E, 10F, 10I, and 10J to be together with the semiconductor device 11A, 11E, 11F, and 11G during the transportation step S3 or S5 in FIG. 1, may be appropriately formed near the center of the IC cover 10E, 10F, 10I, and 10J.

Figure 23:
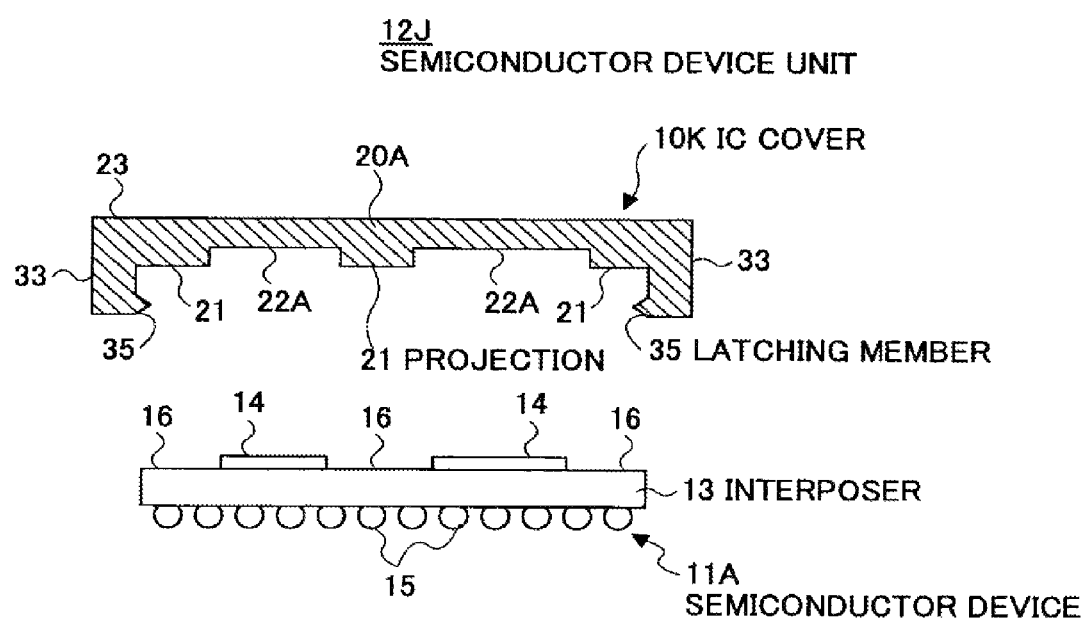
FIG. 23 is a cross-sectional view of an IC cover 10K and the semiconductor device 11A, as a seventh example according to the seventh embodiment. The IC cover 10K and the semiconductor device 11A form a semiconductor device unit 12J.

FIG. 23 is a cross-sectional view of an IC cover 10K and the semiconductor device 11A, as a seventh example according to the seventh embodiment. The IC cover 10K and the semiconductor device 11A form a semiconductor device unit 12J.

In FIG. 23, the interposer 13 of the semiconductor device 11A, specifically, the bottom surface of the interposer 13 is used as the first positioning member, and an engagement wall 33 is formed on the IC cover 10K as the second positioning member. In this example, on the inner side of the engagement wall 33, a latching member 35 is formed to be projecting toward the inner side.

When the IC cover 10K is attached to the semiconductor device 11A, the latching member 35 latches the interposer 13 at the peripheral part of the bottom surface of the interposer 13, thereby the IC cover 10K is engaged with the semiconductor device 11A. In other words, with the IC cover 10K being attached to the semiconductor device 11A, the interposer 13 is held caught by the latching member 35 and the projections 21. Due to this configuration, once the IC cover 10K is attached to the semiconductor device 11A, it is possible to prevent disengagement of the IC cover 10K from the semiconductor device 11A, therefore effectively protecting the semiconductor device 11A.

The latching member 35 may be formed integrally with the IC cover 10K when fabricating the IC cover 10K. Because the cross section of the latching member 35 possesses a triangular shape (the upper surface and the lower surface are inclined), the IC cover 10K can be easily attached to or detached from the semiconductor device 11A.

Eighth Embodiment

In the preceding embodiments, an IC cover is formed beforehand to have a space for accommodating a semiconductor device. However, if numbers and types of semiconductor chips and electric parts mounted on an interposer of the semiconductor device increase, it becomes cumbersome to form spaces of appropriate sizes and shapes to accommodate all the items.

In this embodiment, instead of fabricating an IC cover in advance, an elastic sheet, or a thermoplastic resin, or a conductive material is used as the IC cover, and thereby avoiding trouble in forming appropriate spaces.

Figure 24B:
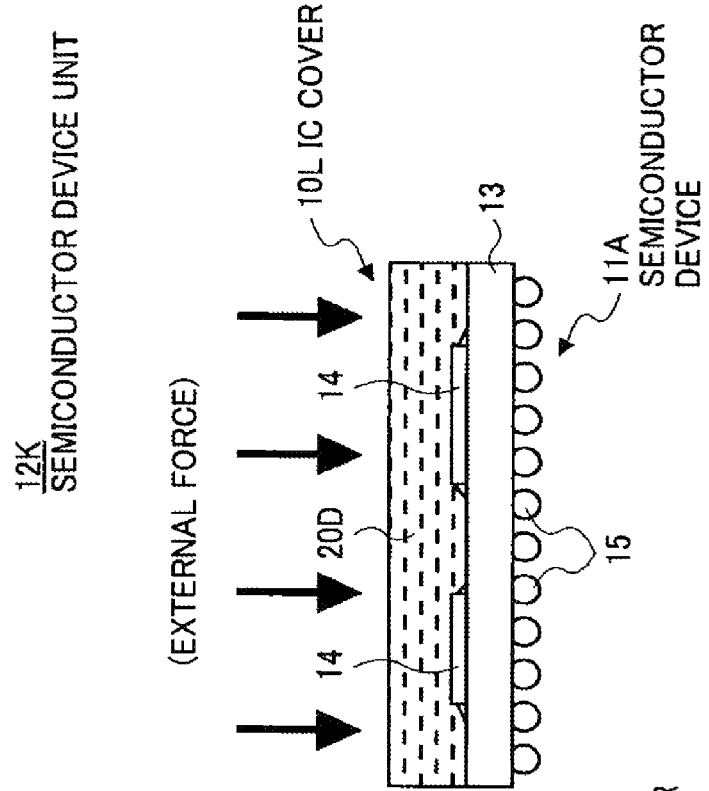
FIG. 24B is a cross-sectional view of a semiconductor device unit 12K according to the eighth embodiment, including the IC cover 10L and the semiconductor device 11A.
Figure 24A:
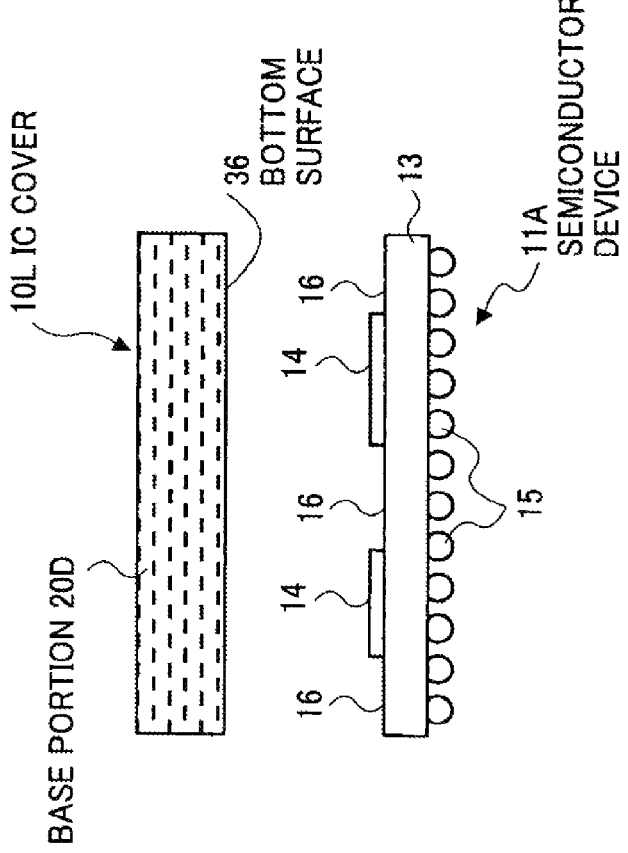
FIG. 24A is a cross-sectional view of an IC cover 10L, which is an elastic body, and the semiconductor device 11A according to an eighth embodiment.

FIG. 24A is a cross-sectional view of an IC cover 10L, which is an elastic body, and the semiconductor device 11A according to an eighth embodiment.

FIG. 24B is a cross-sectional view of a semiconductor device unit 12K including the IC cover 10L and the semiconductor device 11A.

In this embodiment, the same reference numbers are used for the same elements as those mentioned in the preceding embodiments.

As shown in FIGS. 24A and 24B, in correspondence to the shape of the interposer 13, the IC cover 10L is shaped to be a rectangular solid. Certainly, the shape and size of the IC cover 10L can be determined in correspondence to the shape and size of the interposer 13. For example, the IC cover 10L may be formed from a nitrile rubber, or silicone rubber, or other rubbers. When selecting the materials, it is preferable to select materials whose Shore hardness Type A is greater than 50.

To attach the IC cover 10L to the semiconductor device 11A, it is sufficient to just place the IC cover 10L directly on the top surface of the semiconductor device 11A. In this operation, an adhesive agent may be applied on the bottom surface 36 of the IC cover 10L to make the IC cover 10L adhere to the interposer 13.

Because the IC cover 10L is formed from an elastic material, height unevenness of the semiconductor chips 14 and not-illustrated electric parts on the interposer 13 is absorbed by elastic deformation of the IC cover 10L, and therefore, it is not necessary to form spaces for accommodating the semiconductor chips 14 and electric parts as is done in the previous embodiments.

With the IC cover 10L being mounted on the semiconductor device 11A, even when a large external force is imposed on the semiconductor device unit 12K, the external force is absorbed by the elastic deformation of the IC cover 10L. Consequently, due to the elastic IC cover 10L according to the present embodiment, the semiconductor device 11A can be effectively protected.

The elastic IC cover 10L can be repeatedly used until the elastic IC cover 10L degrades in elasticity and cannot deform sufficiently large compared to the height of the electric parts.

Figure 25A:
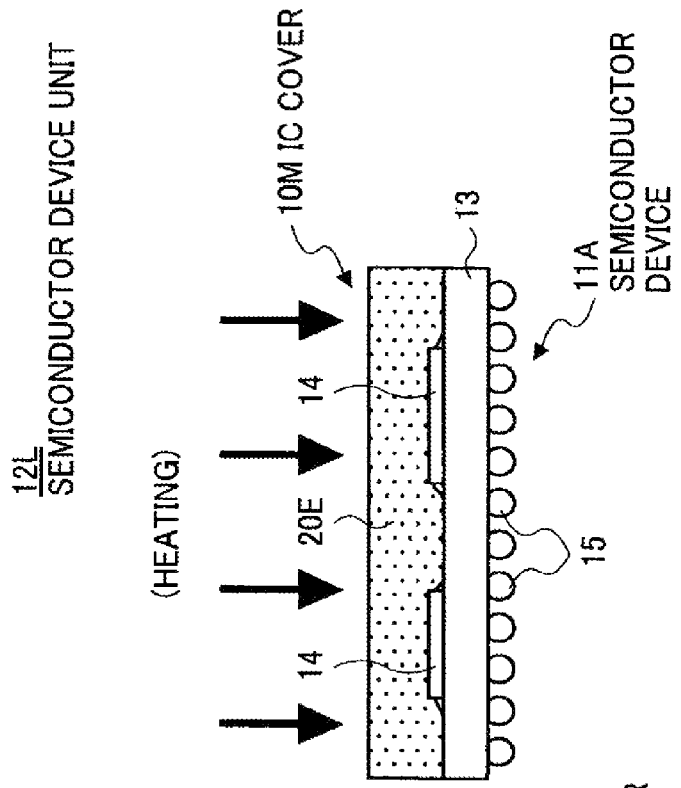
FIG. 25A is a cross-sectional view of an IC cover 10M formed from a thermoplastic resin and the semiconductor device 11A according to the eighth embodiment.

FIG. 25A is a cross-sectional view of an IC cover 10M formed from a thermoplastic resin and the semiconductor device 11A according to the eighth embodiment.

Figure 25B:
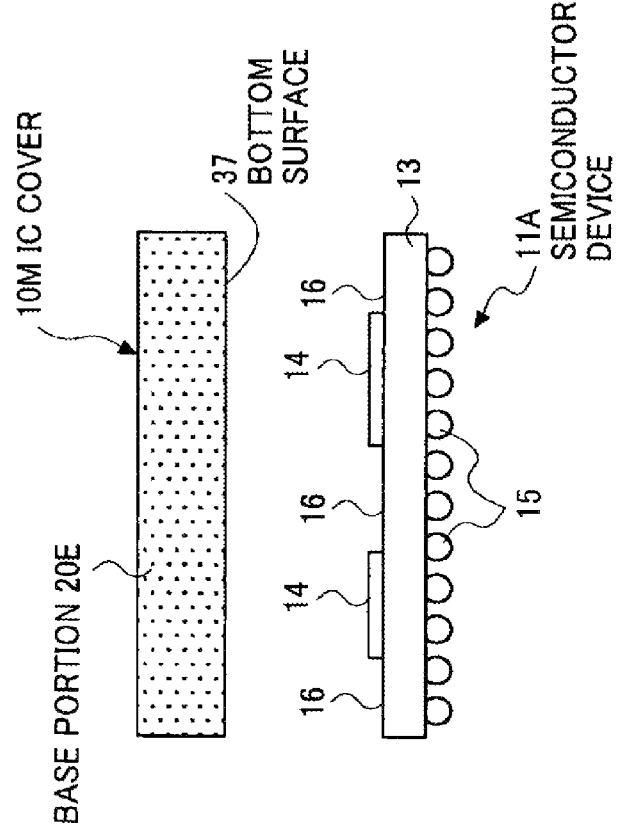
FIG. 25B is a cross-sectional view of a semiconductor device unit 12L including the IC cover 10M and the semiconductor device 11A.

FIG. 25B is a cross-sectional view of a semiconductor device unit 12L including the IC cover 10M and the semiconductor device 11A.

As shown in FIGS. 25A and 25B, in correspondence to the shape of the interposer 13, the IC cover 10M is shaped to be a rectangular solid. Certainly, the shape and size of the IC cover 10M can be determined in correspondence to the shape and size of the interposer 13.

For example, the IC cover 10M may be formed from Poly-Vinyl Chloride (PVC). PVC turns soft at a temperature of 80 C. degrees to 100 C. degrees.

To attach the IC cover 10M to the semiconductor device 11A, it is sufficient to just place the IC cover 10M directly on the top surface of the semiconductor device 11A. During this operation, the IC cover 10M can be heated to a temperature of 80 C. degrees to 100 C. degrees to soften the IC cover 10M, making the IC cover 10M adhesive. Hence, the IC cover 10L adheres to the interposer 13. In this way, the semiconductor device unit 12L shown in FIG. 25B is obtained.

Because the IC cover 10M is formed from a thermoplastic resin, height unevenness of the semiconductor chips 14 and not-illustrated electric parts on the interposer 13 is absorbed by thermal deformation of the IC cover 10M, and therefore, it is not necessary to form spaces for accommodating the semiconductor chips 14 and electric parts as is done in the previous embodiments. That is, even if numbers and types of semiconductor chips and electric parts mounted on the interposer of the semiconductor device increase, because of usage of a thermoplastic resin as the IC cover 10M, the space for accommodating the above items is substantially formed due to the thermal deformation of the IC cover 10M.

Because the IC cover 10M has an adhesive property, and adheres to the semiconductor device 11A once the IC cover 10M is attached to the semiconductor device 11A, the IC cover 10M can hardly break away from the semiconductor device 11A. When it is desired to remove the IC cover 10M from the semiconductor device 11A, it is sufficient to just heat the IC cover 10M again to soften the IC cover 10M. Due to the heating, the adhesive strength decreases, and the IC cover 10M can be easily removed from the semiconductor device 11A.

The elastic IC cover 10M can also be repeatedly used until the IC cover 10M degrades in plasticity and cannot deform sufficiently large compared to the height of the electric parts.

Figure 26:
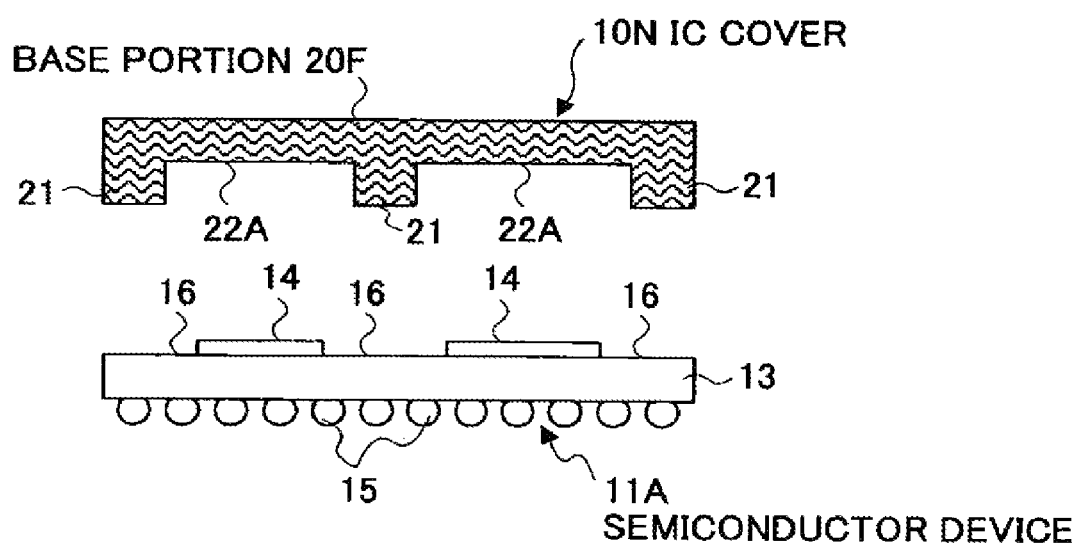
FIG. 26 is a cross-sectional view of an IC cover 10N and the semiconductor device 11A according to the eighth embodiment.

FIG. 26 is a cross-sectional view of an IC cover 10N and the semiconductor device 11A according to the eighth embodiment. In this example, at least the surface of the IC cover 10N is made to be conductive so as to prevent generation of static electricity in the semiconductor device 11A.

As shown in FIG. 26, in the IC cover 10N, at least surfaces of a base portion 20F and projections 21 are made to be conductive.

In order to make the surface of the base portion 20F and the surface of the projections 21 conductive, a conductive material such as poly-carbonate may be coated on the surface of the IC cover 10N; alternatively, the IC cover 10N can be made from poly-carbonate.

Due to this configuration, at least the surfaces of the base portion 20F and the projections 21 in the IC cover 10N are conductive, thereby, when attaching the IC cover 10N to the semiconductor device 11A, even though static electricity is generated between the IC cover 10N and the semiconductor device 11A, the IC cover 10N can remove the static charge. Hence, it is possible to prevent static electricity damage to the semiconductor chips 14 on the semiconductor device 11A and circuits on the interposer 13.

Further, the IC cover 10N may be connected to a ground line formed on the interposer 13. Due to this, the IC cover 10N functions as a shielding case, and in a test of the semiconductor device 11A, the IC cover 10N prevents influence on the semiconductor chips 14 from external stray electromagnetic waves.

While the invention is described above with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the present invention, because a protection cover for a semiconductor device is provided, the semiconductor device is protected and the top surface of the semiconductor device can be made flat, therefore having a uniform height distribution. This improves reliability of a performance test of the semiconductor device.

Further, because of presence of the protection cover, it is possible to prevent damage to the semiconductor device during transportation, or packaging for shipment.

What is claimed is:

1. A method for protecting a semiconductor device that is subjected to a plurality of treatments after fabrication but before shipment, comprising the step of:

performing the treatments with a protection member being attached to the semiconductor device, wherein the protection member comprises:

a base portion with a first surface and a second surface, said first surface being flat, and the second surface having a projecting portion and a depressed portion; and an engaging portion to engage the protection member with the semiconductor device, so as to detachably attach the protection member to the semiconductor device, said engaging portion extending from a peripheral portion of said second surface, wherein the semiconductor device has a substrate, parts mounted on the substrate, and a plurality of solder balls attached to the substrate, said projected portion of said second surface is shaped so as to contact with the substrate of the semiconductor device, said depressed portion of said second surface is shaped so as not to contact the parts mounted on the substrate, and said engaging portion is to be engaged with a periphery of the substrate of the semiconductor device.

2. The method as claimed in claim 1, wherein the treatments include transportation of the semiconductor device with the semiconductor device being held by a suction chuck through a suction hole formed on the protection member.

* * * * *